(12) United States Patent
Kuthi et al.

(10) Patent No.: US 9,659,757 B2
(45) Date of Patent: *May 23, 2017

(54) MEASURING AND CONTROLLING WAFER POTENTIAL IN PULSED RF BIAS PROCESSING

(71) Applicant: LAM RESEARCH CORPORATION, Fremont, CA (US)

(72) Inventors: Andras Kuthi, Thousand Oaks, CA (US); Stephen Hwang, Fremont, CA (US); James C. Vetter, Pine Grove, CA (US); Greg Eilenstine, Pleasanton, CA (US); Rongping Wang, Cupertino, CA (US); Tuan Ngo, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 1132 days.

This patent is subject to a terminal disclaimer.

(21) Appl. No.: 13/663,393

(22) Filed: Oct. 29, 2012

(65) Prior Publication Data

US 2013/0050892 A1    Feb. 28, 2013

Related U.S. Application Data

(60) Continuation of application No. 13/456,122, filed on Apr. 25, 2012, now Pat. No. 8,303,763, which is a (Continued)

(51) Int. Cl.
*H01J 37/32* (2006.01)
*H01L 21/66* (2006.01)

(52) U.S. Cl.
CPC ...... *H01J 37/32935* (2013.01); *H01J 37/321* (2013.01); *H01J 37/32174* (2013.01); *H01L 22/26* (2013.01)

(58) Field of Classification Search
CPC .............. H01J 37/32935; H01J 37/321; H01J 37/32174; H01L 22/26
See application file for complete search history.

(56) References Cited

U.S. PATENT DOCUMENTS 5,997,687 A * 12/1999 Koshimizu ....... H01J 37/32082
118/723 E

OTHER PUBLICATIONS

Redmayne, Derek, "Infinite Sample-and-Hold Outperforms Many Legacy Sample-and-Hold Amplifiers" Linear Technology Magazine, Nov. 2000, pp. 33-36.*

\* cited by examiner

*Primary Examiner* — Anita Alanko
(74) *Attorney, Agent, or Firm* — Martine Penilla Group, LLP

(57) ABSTRACT

Apparatus and methods are provided for monitoring a pulsed RF bias signal applied to a chuck in a processing chamber. One method includes operations for detecting voltage values of individual pulses of the pulsed RF bias voltage, and for determining the time for sampling the value of each individual detected pulse. At the sampling time for each pulse, a particular voltage value of the respective individual detected pulse is sampled and the particular voltage value is held. Each particular voltage value represents a characteristic peak-to-peak voltage value of each individual detected pulse. A feedback signal representing the characteristic peak-to-peak voltage value for a voltage envelope of one of the individual detected pulses is generated, and the voltage of the pulsed RF bias voltage signal applied to the chuck is adjusted according to a difference between the feedback signal and a desired voltage value of the pulsed RF bias voltage signal.

11 Claims, 17 Drawing Sheets

Related U.S. Application Data division of application No. 11/805,607, filed on May 23, 2007, now Pat. No. 8,192,576.

(60) Provisional application No. 60/826,370, filed on Sep. 20, 2006.

MEASURING AND CONTROLLING WAFER POTENTIAL IN PULSED RF BIAS PROCESSING

CLAIM OF PRIORITY

This application is a Continuation application under 35 USC §120 and claims priority from U.S. application Ser. No. 13/456,122, and entitled "Measuring and Controlling Wafer Potential in Pulsed RR Bias Processing," filed on Apr. 25, 2012, which is a Divisional application of U.S. patent application Ser. No. 11/805,607 filed on May 23, 2007, and entitled, "Method and Apparatus to Measure Wafer Potential In Pulsed RF Bias Processing," which claims priority from U.S. Provisional Patent Application No. 60/826,370 entitled "Method and Apparatus to Measure Wafer Potential In Pulsed RF Bias Processing," filed on Sep. 20, 2006, all of which are incorporated herein by reference in its entirety for all purposes.

BACKGROUND

1. Field of the Invention

The present invention relates to semiconductor fabrication equipment, and more particularly, the present invention relates to methods, circuits and systems that control the application, measurement, feedback and processing of signals associated with pulsed RF power delivery to a processing chamber or electrode.

2. Description of the Related Art

In semiconductor fabrication, integrated circuit devices are fabricated from semiconductor wafers that are placed through numerous processing operations. Many of such operations are commonly carried out in processing chambers in which layers, such as dielectric and metallization materials, are successively applied and patterned to form multi-layered structures. For example, some of these layers (e.g., $SiO_2$) are commonly deposited in chemical vapor deposition (CVD) chambers, and then photoresist materials are spin-coated and placed through photolithography patterning. When a photoresist mask is defined over a particular surface, the semiconductor wafer is placed into a plasma etching chamber in order to remove (i.e., etch) portions of the underlying materials that are not covered by the photoresist mask.

Processing chambers may be used to etch the materials or deposit the materials onto surfaces or layers of a wafer, or to implant materials into the surfaces or layers. In some physical implementations of etch, deposition, or implantation chambers, radio frequency power (RF) is used. For example, in the processing chamber, plasma may be generated by applying the RF power to an inductive coil, and typically the RF power is applied at 13.56 MHz.

Separate from the inductive coil, the wafer is mounted in the chamber on an electrode. For process control, such as controlling the etching of, or deposition onto, or implantation into, the wafer, other (or second) RF power is separately communicated to the chamber, and in particular, is applied to the electrode on which the wafer is mounted. Specific examples of the processing chambers are those configured with such inductive coil and electrode separately from each other, in which the electrode receives such second RF power, and in which that second RF power is pulsed. Methods and systems for accurately controlling the voltage level applied by the pulsed RF power, as delivered to the chuck electrode of a chamber suffer in many respects.

What is needed then, are apparatus, circuits, and methods for measuring and determining the RF bias voltage on the wafer that are not influenced by, or a function of, the duty cycle of the pulsed RF bias signal. What is also needed then, are apparatus, circuits, and methods in which the determination of a value of the RF bias voltage on the wafer is independent of the duty cycle of the pulsed RF bias signal. What is further needed then, are apparatus, circuits, and methods in which the determination of a value of the RF bias voltage on the wafer is not based on an OFF mode of the pulsed RF bias signal.

It is in this context that embodiments arise.

SUMMARY

Broadly speaking, embodiments of the present invention fill these needs by providing semiconductor fabrication apparatus, circuits, firmware, software, and methods configured for measuring and determining the RF bias voltage on the wafer. In one embodiment, the determining is not influenced by, or a function of, the duty cycle of the RF bias signal. In more detail, such embodiments provide apparatus, circuits, firmware and methods in which the determination of a value of the RF bias voltage on the wafer is independent of the duty cycle of the pulsed RF bias signal. Such embodiments provide apparatus, circuits, and methods in which the determination of a value of the RF bias voltage on the wafer is not based on the OFF modes of the pulsed RF bias signal. In one such embodiment the determination of a value of the RF bias voltage on the wafer is based on peak-to-peak voltage values of the pulses of the pulsed RF bias signal during the ON mode of those pulses.

In one embodiment, a plasma chamber for processing a semiconductor wafer is provided. The plasma chamber includes circuitry for monitoring and adjusting a pulsed RF bias voltage signal to be applied to a chuck in the plasma chamber, where the chuck is configured to mount the wafer for processing. The circuitry includes an RF bias voltage detector for detecting individual pulses of the pulsed RF bias voltage signal applied to the chuck. A timing circuit is provided for determining a time for sampling each of the individual detected pulses and a sample and hold circuit. The sample and hold circuit is triggered at the sampling time for sampling each of the individual detected pulses to determine and hold a voltage value representing a peak peak-to-peak voltage value of each individual detected pulse, and the sample and hold circuit is configured to provide a feedback signal representing the peak peak-to-peak voltage value of at least one of the detected pulses. Further included is a feedback circuit for adjusting the voltage of the pulsed RF bias voltage signal applied to the chuck according to a difference between the feedback signal and a desired voltage value of the RF bias voltage signal.

In another embodiment, a method of monitoring and adjusting a pulsed RF bias voltage signal to be applied to a chuck in a plasma chamber for processing a semiconductor wafer is provided. The chuck is configured to mount the wafer for processing. The method includes detecting voltage values of individual pulses of the pulsed RF bias voltage applied to the chuck and determining a time at which to sample a voltage value of each of the individual detected pulses. Then, at the sampling time with respect to each of the individual detected pulses sampling a particular voltage value of the respective individual detected pulse and holding the particular voltage value. Each respective particular voltage value representing at least a peak peak-to-peak voltage value of each respective individual detected pulse. Then, generating a feedback signal representing at least the peak peak-to-peak voltage value for a voltage envelope of one of the individual detected pulses. The method then includes adjusting the voltage of the pulsed RF bias voltage signal applied to the chuck according to a difference between the feedback signal and a desired voltage value of the pulsed RF bias voltage signal.

Optionally, more than one peak peak-to-peak voltage values may be averaged to generate the feedback signal. Further, optionally, more than one peak-to-peak voltage values in each voltage envelope may be detected and held. Still further, the processing may be performed by circuitry (analog or digital, or combinations thereof), firmware, software, combinations of firmware and software, and combinations of firmware, software and hardware. In either embodiment, the processing enables accurate adjusting of the voltage of the pulsed RF bias voltage signal applied to the chuck.

Other embodiments of the present invention may measure a pulsed RF bias signal applied to a bias electrode of a wafer processing chamber. A detector may be configured for response to the pulsed RF bias signal, the pulsed RF bias signal comprising of a pair of ON mode pulses separated by an OFF mode, and the detector may be configured to generate a detector signal comprising successive envelopes. Of course, as noted above, only one envelope is necessary, but this embodiment shows examples of two or more successive envelopes. Thus, amplitudes of a respective one of the envelopes may be proportional to peak-to-peak voltage values as a function of time of a respective ON mode pulse. A sample and hold circuit may be provided for sampling each successive one of the envelopes. The sampling identifies one of the amplitudes of the envelope. The identified one amplitude represents the characteristic peak-to-peak voltage value of the respective ON mode pulse corresponding to the envelope. In some embodiments, it may be the greatest or one or more of the larger peak-to-peak voltages. The circuit generates an output signal in proportion to the identified one amplitude.

Still other embodiments of the present invention may measure the pulsed RF bias signal applied to the bias electrode. A detector may be configured for response to the pulsed RF bias signal, the pulsed RF bias signal consisting of pairs of ON mode pulses, each pair being separated by an OFF mode. Each ON mode pulse may consist of cycles, each cycle being characterized by a voltage amplitude that varies with respect to time. The detector may be configured so that the response is to each ON mode pulse and for generating a detector signal in the form of successive envelopes. Amplitudes of one of the envelopes consist of amplitude values that are proportional to peak-to-peak voltage values of the cycles of a respective one of the ON mode pulses. The amplitudes of a respective envelope may be with respect to time only during a respective ON mode pulse, and each envelope is independent of a duty cycle and of a frequency of the pulsed RF bias signal.

BRIEF DESCRIPTION OF THE DRAWINGS

The embodiments of the present invention will be readily understood by reference to the following detailed description in conjunction with the accompanying drawings in which like reference numerals designate like structural elements.

DETAILED DESCRIPTION

Figure 1:
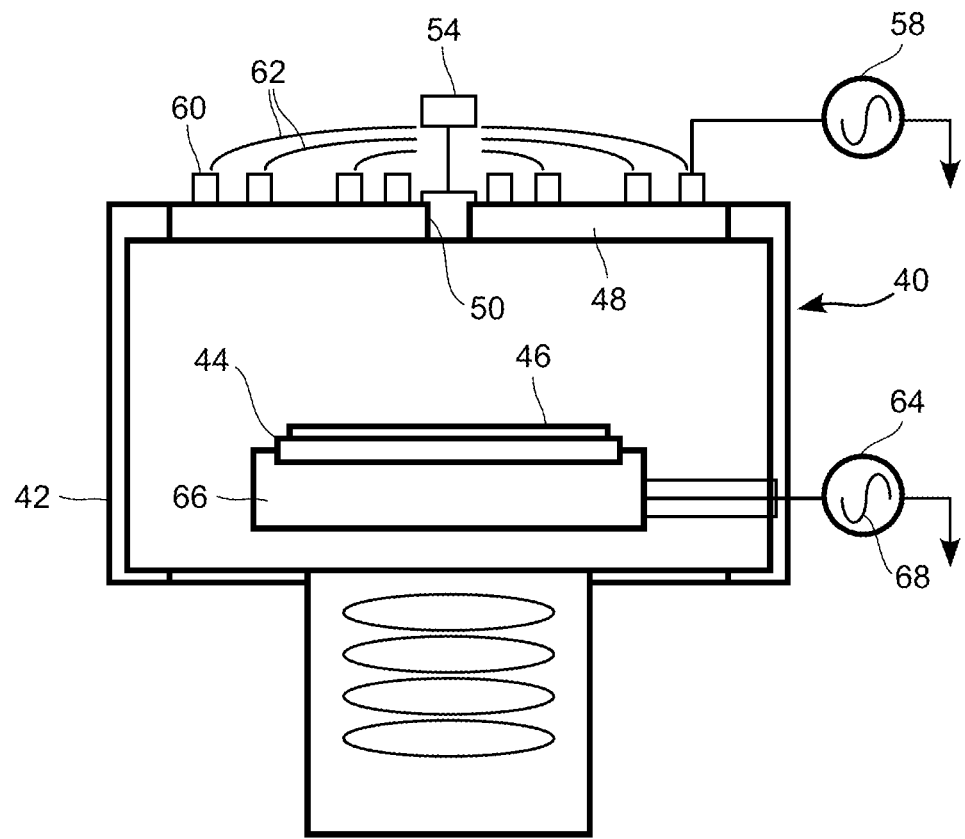
FIG. 1 is a schematic diagram showing an embodiment of apparatus of the present invention for controlling the application, measurement, feedback and processing of signals associated with pulsed RF power delivery to a processing chamber.

The present invention defines apparatus and methods for processing information to enable improved control of signal data provided to a processing chamber that is used in fabricating substrates.

In embodiment, the processing chamber is a plasma reactor with bias RF delivery. The peak RF voltage is a parameter for controlling the wafer potential. For applications using pulse modulated RF bias delivery, the peak voltage during the "HIGH" portion of the pulse is also an important parameter (as opposed to average potential over whole pulse). One structure example may be to use (A) a voltage divider, (B) a fast envelope detector (and filter), and (C) sample and hold circuit. In one embodiment, the sample and hold circuit may be comprised of (i) a trigger signal to signify the beginning of the "HIGH" portion of the pulse, either from the envelope signal or from an external sync signal (ii) a timing delay (configurable), (iii) a sampling of the voltage signal, either single point or multiple point average, (iv) an output of the single sample or multi-point average of the pulse, and (v) a hold to maintain the same output reading until a new trigger is detected. Further the example structure may also include (D) a close-loop control of the peak RF voltage during a HIGH portion.

In the following description, numerous specific details are set forth in order to provide a thorough understanding of embodiments of the present invention. It will be apparent, however, to one skilled in the art that the present invention may be practiced without some or all of these specific details. In other instances, well known process operations have not been described in detail in order not to obscure the present invention.

System and Method Design Considerations

In describing process control, such as controlling the etching or deposition or implantation, the second RF power applied to such electrode may be referred to as RF bias or RF bias power or preferably, an RF bias signal, and such electrode may be referred to as the bias electrode. These terms distinguish from the RF power separately applied to the inductive coil to generate the plasma. During processing, without process control or without proper process control, there is a variation of the impedance (or load) presented to the bias electrode. This variation may e.g., be based on the type of gas in the chamber, the gas pressure, or the inductive load. For optimal process control, the RF bias signal applied to the bias electrode must be controlled so that the electrical characteristics of the plasma are held constant.

In the past, attempts have been made to control the RF bias signal, e.g., during attempts to accurately control ion bombardment energy. Such ion bombardment energy is associated with an RF voltage applied to the wafer, i.e., an RF bias voltage. This RF bias voltage on the wafer results from the RF bias signal applied to the bias electrode. For such control, the RF bias voltage is often pulsed, and may be applied by a pulsed RF bias signal. Problems related to this pulsing may be understood by reference to the characteristics of the pulsed RF bias signal. In general, the pulsed RF bias signal may be in the form of an RF bias pulse followed by a zero voltage condition (no pulse) followed by another RF bias pulse, etc. The pulsed RF bias signal is thus a series ("a series of RF bias pulses") defined by one of the RF bias pulses, then the zero voltage condition (no pulse), then another RF bias pulse, then the zero voltage condition (no pulse), etc. Such a series of RF bias pulses may continue as long as there is a need for process control.

Each such RF bias pulse of the series of RF bias pulses may be a single RF bias voltage signal having an amplitude that varies between plus and minus voltage values at a frequency in the RF range of about 0.1 MHz to as much as 60 MHz. A common frequency may be in a range of about 0.4 MHz to about 2 MHz. The single RF bias voltage signal may have a duration (an "ON" duration) of from about 10 microseconds (μs) to about 100 μs. As an RF signal, the single RF bias voltage signal is composed of cycles (or oscillations or periods, e.g., sine waves) in that exemplary frequency range. Each cycle has an amplitude (i.e., a voltage value) that varies between one plus and one minus value.

Generally, the plus value of the amplitude of one (or more) of the cycles is greater than the plus values of all of the other cycles of the single RF bias voltage signal, and is referred to as a positive "peak" value (or peak voltage value) of the single RF bias voltage signal. Also, the minus value of the amplitude of one (or more) of the cycles is less than the minus values of all of the other cycles of the single RF bias voltage signal, and is referred to as a negative "peak" value (or peak voltage value) of the single RF bias voltage signal. For convenience, the value of the amplitude between the positive and negative peaks of each cycle is referred to as the peak-to-peak voltage value, or PTP voltage value.

This single RF bias voltage signal, or RF bias pulse, may be referred to as a "burst" to indicate that one such RF bias pulse stops at the end of that ON duration, i.e., stops at the end of a period of time ("tON") in which the one RF bias pulse is "ON". The condition in which the RF bias pulse is ON is referred to as an "ON mode". When this RF bias pulse (the burst) stops at the end of the time period tON, the RF bias pulse is "OFF" and there is a time period ("tOFF") in which there is no amplitude, i.e., the voltage is zero (referred to as "no pulse"). The condition in which the RF bias pulse is OFF is referred to as an "OFF mode". After time period tOFF, there is another RF bias pulse, i.e., another burst, and another time period tON.

With these characteristics of the pulsed RF bias signal in mind, it may be understood that a "duty cycle" of the series of RF bias pulses may be defined by a ratio of time ON to the sum of time ON and time OFF, and may be based on times in a range of about 10 microseconds (μs) to about 100 milliseconds (ms), for both the time periods of the ON mode and of the OFF mode. Such times may result in the RF bias pulses of the series of RF bias pulses being at a pulse rate of about of 1 Hz to about 10 kHz.

Problems resulting from this pulsed RF bias signal relate to a typical way of measuring the voltage of the pulsed RF bias signal, that uses a voltage divider. The output of such typical voltage divider method is a function of the parameters of the pulses of the pulsed RF bias signal, e.g., duty cycle and pulse frequency. As described above, the duty cycle is a function of both the duration of the ON mode and the duration of the OFF mode. Because the ON mode of the pulsed RF bias signal is usually at the pulse rate in the range of about 1 Hz to about 10 kHz, such pulse rate is faster than the response time (~1 sec) of a typical feedback loop. An accurate bias voltage of the pulsed RF bias signal may not simply be based on an average of the RF bias voltage over time (i.e., not averaged over the entire response time), because such average would depend on the pulse parameters, such as duty cycle and pulse frequency. To clearly identify such average that is dependent on the pulse parameters, the average of the RF bias signal over time as determined by the typical voltage divider is referred to below as the "PPD average", or "PPD average voltage". This PPD average is based on the PTP voltage values of the cycles of each RF bias pulse as well as on the zero voltage value of the OFF modes between these RF bias pulses of the RF bias signal. In the experience of the Applicants of the embodiments of the present invention, the PPD average would, e.g., be less than the voltage divider output from only the highest PTP voltage value of the pulses of the pulsed RF bias signal, and the amount of the difference is difficult to determine.

Moreover, Applicants of the embodiments of the present invention have observed that because the output of such voltage divider is a function of the duration of the OFF mode, even though the PTP voltages of the bias pulses of the pulsed RF bias signal may be the same over time (for example), any change in the duty cycle would nonetheless change the value of the PPD average voltage of the pulsed RF bias signal. As a result, such Applicants have concluded that when a feedback error signal applied to the typical feedback loop is based on such PPD average, and when that PPD average voltage is used as a representation of a peak-to-peak RF voltage of the pulsed RF bias signal that is applied to the bias electrode, the feedback error signal does not represent only the value of the peak-to-peak RF voltages. Thus, by such typical voltage divider method, there is error in the determination of the RF bias voltage on the wafer. As a result, the Applicants of the embodiments of the present invention have concluded that the use of the PPD average voltage, such as is obtained by the voltage divider method, does not provide a desirable control parameter on which to base the feedback error signal for control of the exemplary etching or deposition or implantation processes. Embodiments improving on the drawbacks noted above will now be described in greater detail.

With the above considerations in mind, the following will define several example circuit and system configurations. However, it should be understood that modifications may be possible, as defined by the appended claims. Specifically, although reference is made to certain circuit designs, it should be understood that the functionality can be implemented in a number of forms. For instance, the functionality performed by circuits (e.g., analog and digital), can be re-rendered into firmware. Additionally, firmware can be executed alone or in conjunction with software control or assistance to complete or partially complete processing steps or communication.

II. Example System and Method Design Configurations

FIG. 1 shows a schematic view of an embodiment of apparatus 40 of the present invention for controlling the application, measurement, feedback and processing of signals associated with pulsed RF power delivery to a processing chamber or electrode via a pulsed RF bias signal. In embodiments of the present invention, the determination of values of the pulsed RF bias signal is not influenced by, or a function of, the duty cycle of the pulsed RF bias signal, and is thus independent of the duty cycle of the pulsed RF bias signal, and is not based on OFF modes of the pulsed RF bias signal.

In one such embodiment the determination of a value of the RF bias voltage on the wafer is based only on the pulses of the pulsed RF bias signal, so that the determination is made only during the ON modes of the pulsed RF bias signal. In one such embodiment the determination of a value of the RF bias voltage on the wafer is based only on an average of the characteristic peak-to-peak voltage values of a preset number of pulses of the pulsed RF bias signal and only during the ON mode of those pulses. In some embodiments, the characteristic peak-to-peak voltage may be the greatest or one or more of the larger peak-to-peak voltages.

FIG. 1 is a schematic diagram showing the apparatus 40 including a vacuum processing chamber 42 having a substrate holder 44 providing a suitable clamping force to a substrate 46 that is processed in semiconductor manufacturing operations, for example. Such substrate may, e.g., be a semiconductor wafer, or another base that is processed in making a device or component, e.g., insulator or conductor or a combination of various materials. The top of the chamber 42 may be provided with a chamber window, such as a dielectric window, 48.

A port 50 is shown provided in the window 48 to permit access to the interior of the chamber 42. FIG. 1 also schematically shows the chamber 42 provided with facilities 54 that require access to the chamber 42 via the port 50. The facilities 54 may require such access to facilitate conducting deposition or etching or implantation processes in the chamber 42, such as by supplying process gases to the chamber. As one example of the facilities 54, process gases may be supplied from one or more gas supplies through the port 50 into the chamber 42. A pump (not shown) may reduce the pressure in the chamber 42 to a pressure in an exemplary range of 1 to 1000 milliTorr.

For deposition or etching or implantation processes, a first source 58 of RF energy with an impedance matching circuit is connected to a coil 60 to energize the gas in the chamber and maintain a high density (e.g., $10^{-11}$ to $10^{-12}$ ions/cm$^3$) plasma in the chamber 42. The coil 60 may be operated at a typical fixed frequency of 13.56 MHz, and may be a type that inductively couples RF energy into the chamber 42 through the window 48 to provide the high density plasma for conducting these processes in the chamber 42. During that coupling, the coil 60 generates an electric field (see lines 62, FIG. 1).

FIG. 1 also shows that for process control, such as controlling the etching, deposition, or implantation, second RF power is separately communicated to the chamber by a second RF source 64. The source 64 may include a matching network comprising variable reactances. The matched second RF power is applied to an electrode 66 in the form of a second RF signal 68.

The variable reactances of the matching network are controlled to match the impedance of the second RF signal 68 to the impedance of the electrode 66. The load coupled to the electrode 66 under the substrate holder 44 is primarily the plasma in chamber 42, and the load imposed by the plasma is non-symmetrical because the plasma acts as a diode. The second RF signal 68 applied to the electrode 66 interacts with charged particles in the plasma to bias the substrate 46.

In the embodiments of the present invention, the RF sources 58 and 64 are separately communicated to the chamber 42, with the inductive coil 60 and electrode 66 separate from each other. In describing process control, such as controlling exemplary etching, deposition, or implantation, the second RF signal 68 applied to such electrode 66 may be referred to as RF bias or RF bias power or preferably, the RF bias signal, and such electrode 66 may be referred to as the bias electrode. These terms distinguish from the RF power separately applied by the first RF source 58 to the inductive coil 60 to generate the plasma.

During processing, without process control or without proper process control, there is a variation of the impedance (or load) presented to the bias electrode. This variation may e.g., be based on the type of gas in the chamber 42, the gas pressure, or inductive load. For optimal process control, the RF bias signal 68 applied to the bias electrode 66 must be controlled so that the electrical characteristics of the plasma are held constant.

Figure 2:
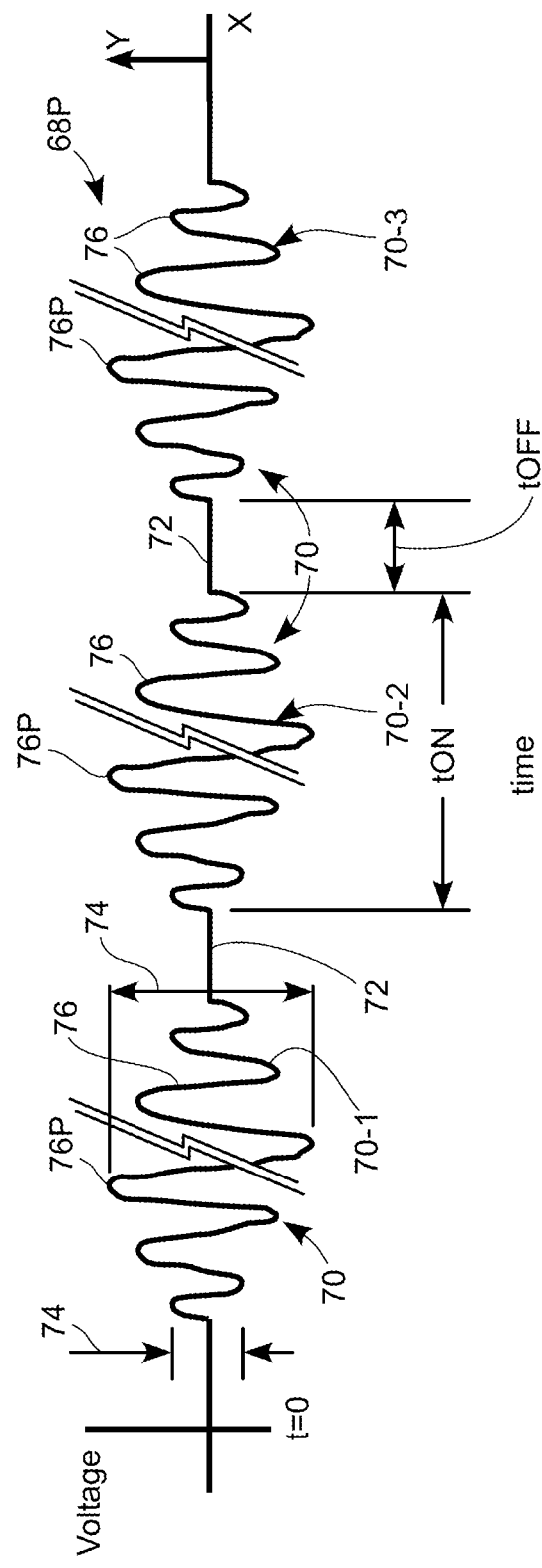
FIG. 2 is a graph showing time (X axis) vs. voltage (Y axis), illustrating that a pulsed RF bias signal may be in the form of an RF bias pulse followed by a zero voltage condition (no pulse) followed by another RF bias pulse.

The RF bias signal 68 is controlled, e.g., to accurately control ion bombardment energy in the chamber 42. Such ion bombardment energy is associated with an RF voltage applied to the substrate 46, i.e., referred to as an RF bias voltage VRF2 to distinguish from the RF power from source 58. The RF bias voltage VRF2 on the substrate 46 results from the RF bias signal 68 applied to the bias electrode 66. FIG. 2 shows that for such control, in a preferred embodiment of the present invention, the RF bias voltage VRF2 is pulsed, and may be referred to as the pulsed RF bias signal 68P. The above-described problems related to this pulsing may be understood by reference to the characteristics of the pulsed RF bias signal 68P as shown in FIG. 2.

FIG. 2 is a graph showing time (X axis) vs. voltage (Y axis). FIG. 2 illustrates that the pulsed RF bias signal 68P may be in the form of an RF bias pulse 70 followed by a zero voltage condition 72 (no pulse) followed by another RF bias pulse 70, etc. FIG. 2 shows three exemplary RF bias pulses 70 of the many pulses 70 of the signal 68P. The pulsed RF bias signal 68P is thus a series ("series of the RF bias pulses 70") defined by one of the RF bias pulses 70, then the zero voltage condition 72 (no pulse), then another RF bias pulse 70, then the zero voltage condition 72 (no pulse), etc., continuing for the duration of the signal 68P. Such a series of RF bias pulses 70 may continue (have a duration or time period) as long as there is a need for process control.

FIG. 2 illustrates that each such RF bias pulse 70 of the series of RF bias pulses 70 may be described as a single RF bias voltage signal having an amplitude 74 that extends between a plus peak voltage value and a minus peak voltage value (i.e., extends "peak-to-peak"). The pulses 70 may be at a frequency in the RF range of about 0.1 MHz to about 60 MHz. A common frequency may be in a range of about 0.4 MHz to about 2 MHz. The pulse 70 may be "ON" during an exemplary "ON" time period tON of from about 10 μs to about 100 ms.

As part of the RF bias signal 68P, each of the RF bias pulses 70 (i.e., each of the single RF bias voltage signals) is composed of cycles (or oscillations or periods, e.g., sine waves) 76 in that exemplary frequency range. Each cycle has an amplitude 74 (i.e., a voltage value) that varies between the described plus peak (a plus voltage value) and minus peak (a minus voltage value). The amplitude 74 of the cycle 76 may be referred to as a peak-to-peak value. For ease of description, the abbreviation "PTP" refers to the amplitude 74 of a cycle 76, the amplitude extending "peak-to-peak" and indicating the voltage value of the cycle 76. For ease of illustration, FIG. 2 shows the pulses 70 cutaway, or shortened, in the X axis direction of time "t", it being understood that when the RF pulse 70 is at an exemplary frequency of 0.4 MHz, there may be an exemplary three cycles 76 in about 7.5 to 8 μs.

FIG. 2 also shows that, in general, the PTP voltage value of the amplitude 74 of one (or more) of the cycles 76 may be the greatest, i.e., may have a greatest voltage value of all of the PTP voltage values of all of the other cycles 76 of an exemplary one pulse 70. The cycle 76 having such greatest PTP voltage of the cycles 76 of the one pulse 70 may be referred to herein as a "peak" value (or peak voltage value) of the one pulse 70 and is identified by 76P. Thus, for each of the exemplary three pulses 70 shown in FIG. 2, one cycle 76P is shown with a respective peak voltage value.

This single RF bias voltage signal, or RF bias pulse, 70 may be referred to as a "burst" to indicate that one such RF bias pulse 70 stops at the end of the ON time period, i.e., stops at the end of the period of time ("tON") in which the one RF bias pulse is "ON". The condition in which the RF bias pulse 70 is ON is referred to as an "ON mode". When this RF bias pulse (the burst) 70 stops at the end of the time period tON, the RF bias pulse 70 is "OFF" and there is a time period ("tOFF") in which there is no amplitude 74, i.e., the voltage is zero (referred to as "no pulse"). The condition in which the RF bias pulse 70 is OFF is referred to as an "OFF mode". After time period tOFF, there is another RF bias pulse 70, i.e., another burst, in another time period tON.

The above-described duty cycle of the series of RF bias pulses 70 may be defined by a ratio of time period tON to the sum of time period tON and time period tOFF, and may be based on time periods in a range of about 10 μs to about 100 ms, for both the time periods of the ON mode and of the OFF mode. Such time periods may result in the RF bias pulses 70 of the series of RF bias pulses being at an exemplary frequency, or pulse rate, of about 1 Hz to about 10 kHz.

Another embodiment of the present invention may provide the RF bias signal 68 in the form of a hybrid RF bias signal 68H (not shown). Such hybrid bias signal 68H is composed of a CW portion (not shown) and of a pulsed portion. The pulsed portion is as shown by pulses 70 in FIG. 2, that is, the CW portion is a continuous series of the pulses 70, without any OFF mode or tOFF between pulses 70. The CW portion may be followed by an OFF mode, and the pulsed RF bias signal 68P shown in FIG. 2 may occur for a period of time that extends to a tOFF. The CW portion then resumes as the continuous series of the pulses 70, without any OFF mode or tOFF between pulses 70. The alternating CW and pulsed portions continue as long as this type of process control is desired. The hybrid RF bias signal 68H is described below in terms of configurations of embodiments of the present invention.

Figure 3:
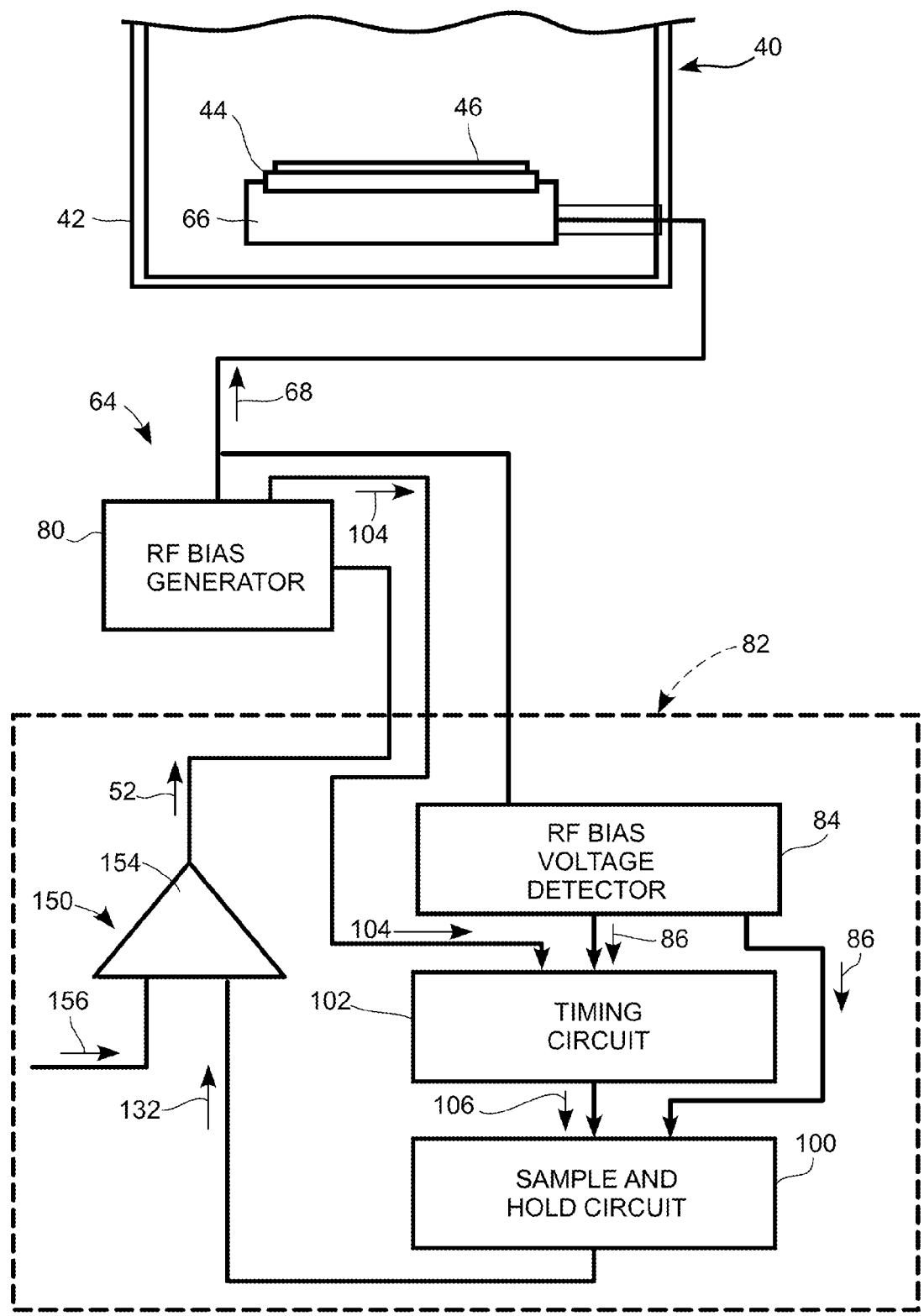
FIG. 3 is a schematic diagram showing apparatus of an embodiment of the present invention including an RF generator that separately communicates a second RF bias signal to the chamber.

FIG. 3 is a schematic diagram showing the apparatus 40, and illustrating an embodiment of the source 64 including an RF generator 80, with the matching network comprising variable reactances. The generator 80 separately communicates the second RF bias signal 68 to the chamber 42. As described above, the RF bias signal 68 supplied by the source 64 may be the pulsed RF bias signal 68P or the hybrid RF bias signal 68H. Signal 68 in FIG. 3 may be either of signal 68P or 68H. Those skilled in the art will recognize that the choice of signals 68P or 68H, and the characteristics of either of such signals, may relate to the particular process to be performed in the chamber 42, and to the type of process control to be achieved. For example, those characteristics may include the RF frequency of the signal 68. For signal 68P such characteristics may include the duration of the tON and tOFF.

With the above exemplary RF frequencies of about 0.1 MHz to 60 MHz, and the common frequency range of about 0.4 MHz to about 2 MHz, tON may be in a range of from about 10 μs to about 100 ms, tOFF may be in a range of from about 10 μs to about 100 ms, and the above-described PTP voltage value may be in a range of from about 20 to about 5000 volts, with a preferred value of about 1000 volts, for example.

FIG. 3 also shows an embodiment of an apparatus 82 for controlling the PTP voltage values of the pulsed RF bias signal 68P supplied by the RF generator 80 to the bias electrode 66 according to the present invention. Such control includes control of the peak-to-peak voltage value of the cycles 76P of each pulse 70. In a general sense, during processing of the substrate 46, without the process control (or without proper process control) of the apparatus 82 there will be the above-described variation of the impedance (or load) presented to the bias electrode 66. By the apparatus 82 the pulsed RF bias signal 68P applied to the bias electrode 66 is controlled so that the electrical characteristics of the plasma are held steady.

Figure 4:
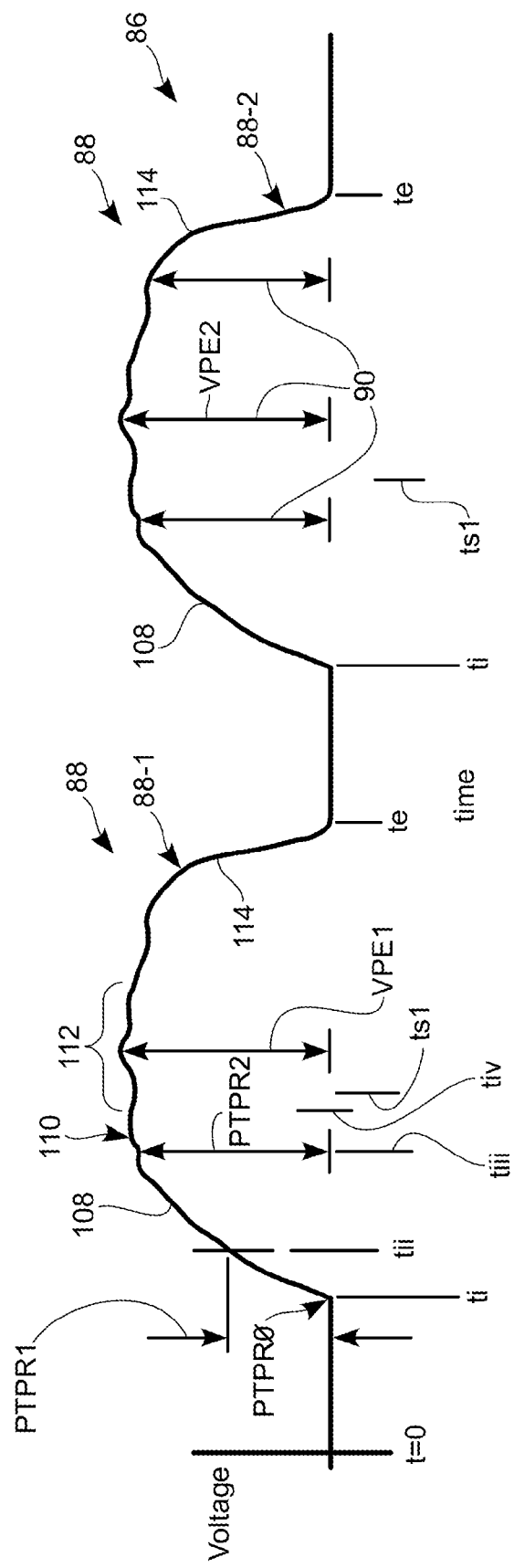
FIG. 4 is a graph showing time (X axis) vs. voltage (Y axis), illustrating an envelope having peak-to-peak (PTP) voltage values corresponding to a cycle of an exemplary pulse of the second RF bias signal, illustrating a rise portion of the envelope.

In view of the above description of the pulsed RF bias signal 68P, the apparatus 82 may be described as being configured for measuring the pulsed RF bias signal 68P that is applied to the bias electrode 66 of the wafer (or substrate) processing chamber 42. FIG. 3 shows the apparatus 82 including a detector 84 configured for response to the pulsed RF bias signal 68P. The detector 84 may be connected to the output of the generator 80, or to the electrode 66, for example. As described above, the pulsed RF bias signal 68P is characterized by at least a pair (i.e., two or more) of the ON mode pulses 70, each two pulses being separated by an OFF mode of duration tOFF. Referring to FIG. 4, the detector 84 is configured to generate a detector signal 86 comprising successive envelopes 88. Two exemplary envelopes 88-1 (occurring first) and 88-2 (occurring next) are shown.

FIG. 4 is a graph showing time (X axis) vs. PTP voltage value (Y axis), illustrating the two exemplary envelopes 88-1 and 88-2. FIG. 4 shows that the envelopes 88-1 and 88-2 are separated in time by tOFF. Each of the envelopes 88 is a composite of the PTP voltage values of the respective many cycles 76 of a respective one of the pulses 70. It may be understood that amplitudes 90 of the envelopes 88 are in proportion to peak-to-peak voltage values as a function of time of a respective ON mode pulse 70.

As described above, in FIG. 2 the cycle 76P is the cycle having the greatest PTP voltage value of all of the cycles 76 of one pulse 70, and is referred to as the "peak" PTP voltage value of the one pulse 70. FIG. 4 shows the exemplary envelope 88-1 corresponding to the one pulse 70 as including the amplitude 90 having a voltage value VPE1 corresponding to the peak cycle 76P. VPE1 is the peak PTP voltage value of the one envelope 88-1, i.e., of the amplitude 90 of exemplary envelope 88-1, and thus represents the greatest PTP voltage value of all of the cycles 76 of the one pulse 70 that corresponds to the envelope 88-1.

Figure 6:
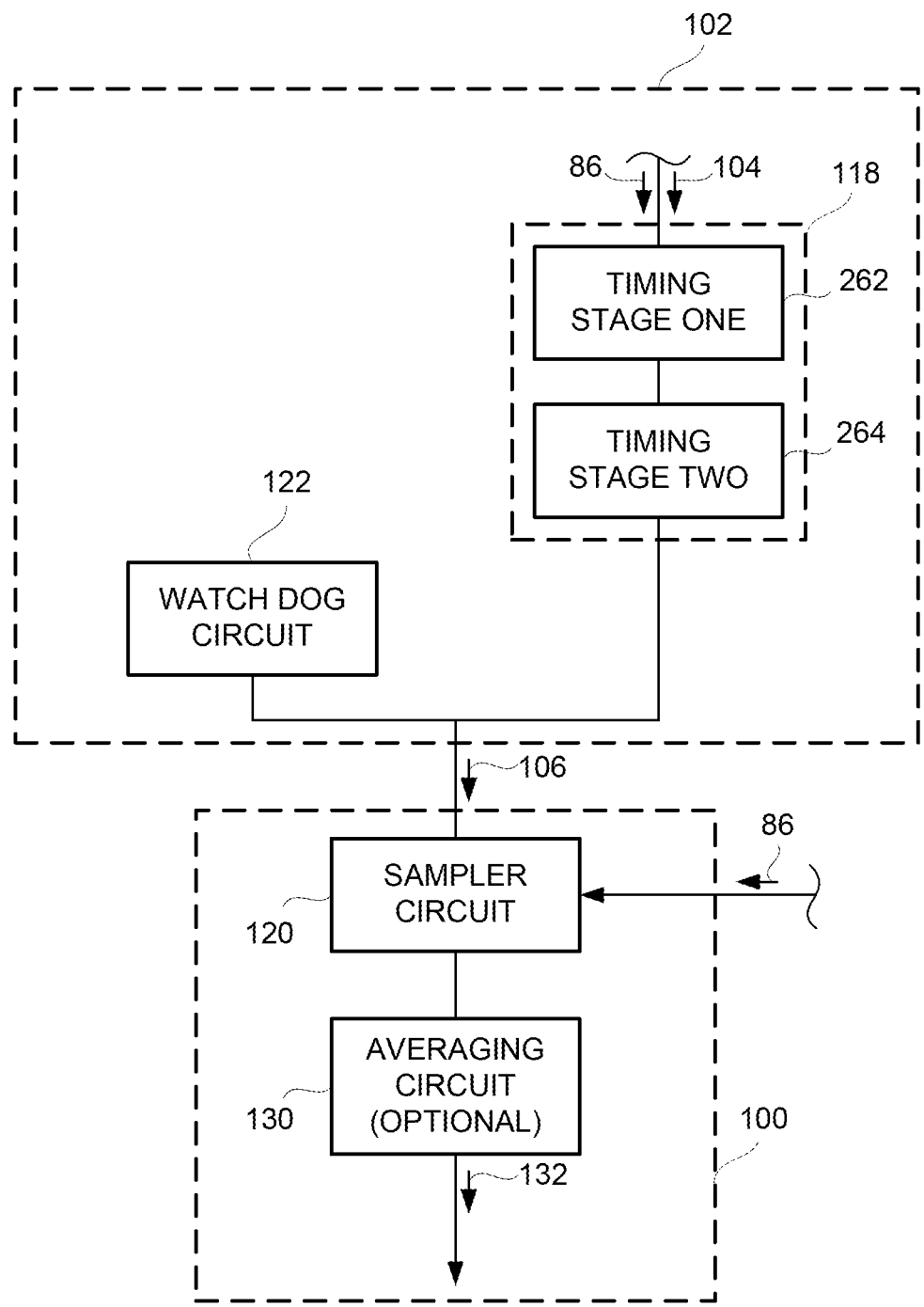
FIG. 6 is a schematic diagram showing a timing circuit configured to trigger a sample and hold circuit so that sampling identifies the peak PTP voltage values VPE of the envelope.

FIG. 3 also shows a sample and hold circuit 100 for sampling each successive one of the envelopes 88. In a general sense, the sampling identifies one of the amplitudes 90 of an envelope 88, and the amplitude 90 represents the greatest (i.e., the maximum, or peak) PTP voltage value of the respective envelope 88 (FIG. 4). This maximum is shown as the exemplary peak PTP voltage value VPE1 of the envelope 88-1, and may be in proportion to the peak (greatest) peak-to-peak voltage value as a function of time of a respective ON mode pulse 70. FIGS. 4 & 6 show a timing circuit 102 configured to trigger the sample and hold circuit 100 so that the sampling identifies the peak PTP voltage values VPE of the envelopes 88.

The timing circuit 102 is configured to respond to either a pulse state signal 104 from the pulse generator 80 or to respond to the envelopes 88 of the detector signal 86. The timing circuit 102 is also configured so that in the absence of pulses 70 of the pulsed RF biased signal 68P, as described below the timing circuit 102 triggers the operation of the sampling and hold circuit 100. In the first case of response to a pulse 70 of signal 68P or the envelope 88, the operation of the trigger circuit 102 is initiated. In general, from the time one of the pulses 70 starts (as indicated by the signal 104) or from the time one of the envelopes 88 starts, the circuit 102 provides time delays that are related to the shape of the envelope 88, and then generates a trigger signal 106 at the end of the time delays. The time delays may be understood by reference to FIG. 4.

FIG. 4 shows that before the exemplary peak PTP voltage value VPE1 corresponding to the cycle 76P of the exemplary pulse 70 of FIG. 2, the exemplary envelope 88-1 has a rise portion 108 of initially increasing PTP voltage values of cycles 76 of the pulse 70. Portion 108 extends from a PTP voltage PTPR0 of zero voltage value at an initial pulse time ti to a low PTP voltage value PTPR1 at time tii and to a higher rising PTP voltage value PTPR2 at time tiii. The time period from time ti to time tiii represents a first time delay. There may also be a transition portion 110 of each envelope 88 following portion 108 and extending to time tiv. During portion 110 the values of the PTP voltage generally become stable. The time period from time tiii to time tiv represents a second time delay.

After the second time delay each envelope 88 may also be characterized by a portion 112 comprising a series of amplitudes 90 of relatively constant PTP voltage values. A sampling time ts1 is in portion 112, such that the exemplary peak PTP voltage value VPE1 of an amplitude 90 of the envelope 88 is generally within the portion 112. After portion 112 a fall portion 114 leads to an end of the envelope 88 (having a zero PTP voltage value) at a time te. In view of this, the amplitudes 90 of the envelopes 88 may be described as defining PTP voltage values (FIG. 4) as a function of time of a respective ON mode pulse 70. The amplitudes 90 include the peak PTP voltage value VPE, which for the envelope 88-1 is shown as VPE1. Such peak-to-peak voltage values VPE are in proportion to peak, peak-to-peak voltage values as a function of time of a respective ON mode pulse 70.

Figure 5:
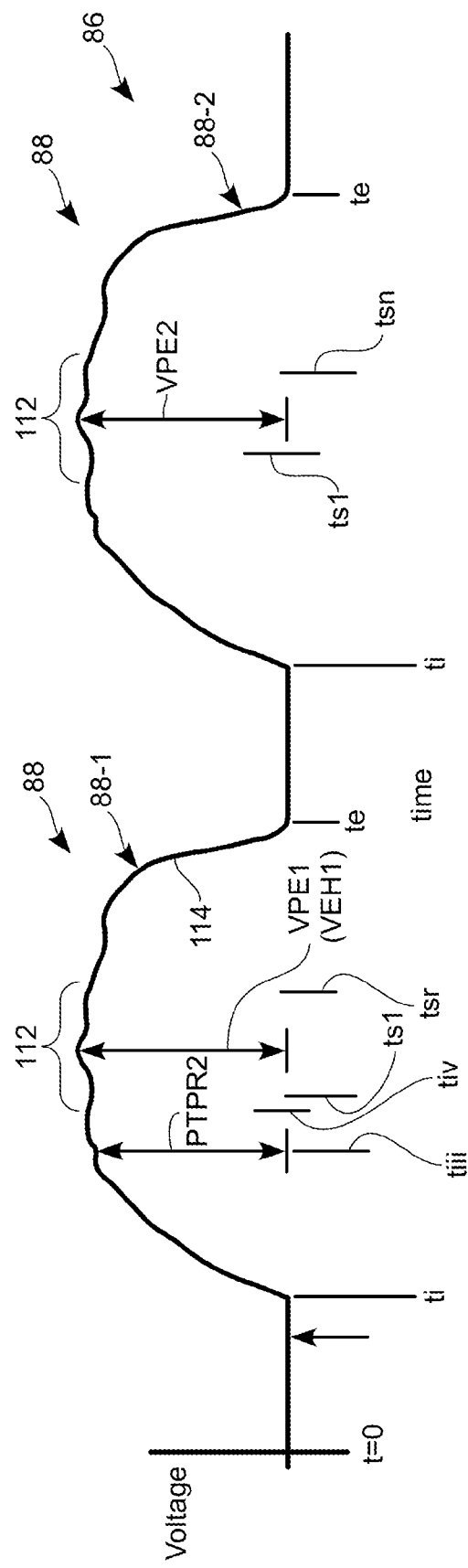
FIG. 5 is a graph showing time (X axis) vs. voltage (Y axis), illustrating a difference between times that represent a second time delay imposed by a timing circuit after the end of the rise portion, also illustrating that during the second time delay voltage values of the envelope become more stable and suitable for being sampled.

With respect to triggering the sample and hold circuit 100, FIGS. 4 and 5 show the same time ti. Time ti indicates the time at which the pulse state signal 104 occurs (or the envelope 88 starts). In FIG. 4, time tiii identifies the end of the rise portion 108, and the end of the first time delay. Typical time delays may be in a range of about 5 μs to about 500 μs, depending on the length of actual RF pulses 70. For example, the envelope rise portion 108 may typically be 3 to 10 RF periods 76, and for an exemplary RF frequency of 0.4 MHz the rise portion 108 may range from 7.5 microseconds to 25 microseconds. The second delay period may, for example, range from a few RF periods 76 to a few tens of RF periods 76, and for the exemplary 0.4 MHz RF frequency the second delay period may range from 10 microseconds to 100 microseconds.

The sample and hold circuit 100 is configured to be triggered on completion of the rise period 108 of each of the envelopes 88, e.g., at the time ts1 following the rise period 108 and the transition period 110. Referring to FIGS. 5 & 6, at time ts1 a delay circuit 118 of the timing circuit 102 outputs a trigger signal 106. In response to the trigger signal 106, at time ts1 a sampler circuit 120 of the sample and hold circuit 100 samples the value VPE as representing the greatest, or peak, PTP voltage value VPE1 of envelope 88-1. This sampling continues at a sampling rate SR, and next samples the next successive exemplary envelope 88-2. The sampling rate is selected with respect to the duration of the ON mode. For example, the sampling occurs once per envelope. Thus, that one peak PTP voltage value VPE of the amplitude 90 is sampled for each envelope 88, and is shown as VPE1 for the envelope 88-1 and VPE2 for envelope 88-2.

Another aspect of the timing circuit 102 relates to the hybrid RF bias signal 68H. As described above, the hybrid RF bias signal 68H includes a CW portion, and includes the pulsed portion (FIG. 2). The timing circuit operation with respect to the pulsed portion is described above. However, the CW portion does not have a pulse 70. Instead, the CW portion is a continuous series of RF cycles (referred to as CW cycles 121, not shown). Thus, the RF generator 80 does not generate the pulse rate signal 104 because the signal 104 only indicates the start of the generation of a pulse 70 of the pulsed RF bias signal 68P. Similarly, for the CW portion there is no envelope 88 that corresponds to a pulse 70. Thus, neither of the above two ways of triggering the timing circuit 102 exists. To continue to cause the sample and hold circuit 100 to sample the measured cycles 121 of the CW portion as measured by the detector 84, FIG. 6 shows the timing circuit 102 also configured with a watchdog circuit 122 to generate the trigger signal 106 after a suitable time delay that is configured to make sure that no detector signal 86 has been received defining one of the envelopes 88 and no pulse state signal 104 has been received from the generator 80.

In response to each trigger signal 106 from the circuit 122, the sampler circuit 120 of the sample and hold circuit 100 samples the peak-to-peak voltage values of the successive CW cycles 121 of the CW portion of the RF bias pulse 68H. This sampling continues at a sampling rate SR corresponding to the requirements of control loop stability. This sampling rate SR may be in a range from about 10 Hz to about 10 kHz, and may typically be at 1 kHz. Thus, the watchdog circuit 122 provides the control circuit 82 with an ability to measure the CW portion of the RF bias signal 68H without interfering with the benefits of the detector 84 and the sample and hold circuit 100, that combine for operations on an envelope 88-by-envelope 88 basis, independent of the OFF modes between pulses 70 of the signal 68P.

FIG. 6 shows that the sample and hold circuit 100 can also be optionally configured with an averaging circuit 130. If no averaging is done, data from a single envelope can be used for the adjustment. The circuit 130 is configured to define a preset number N of successive envelopes 88 according to an update frequency (or rate) of the generator 80. The update frequency defines how often feedback is to be provided to the generator 80. The feedback causes the generator 80 to generate the desired PTP voltage values of the pulsed RF bias signal 68P applied to the bias electrode 66 according to the embodiments of the present invention. The update frequency may be expressed as one update per one time period, and may be one update per a time period of 100 ms, for example. If one envelope 88 occurs every 1 ms, then 100 envelopes 88 will occur between updates in the 100 ms between updates, and N is an exemplary 100.

The sample and hold circuit 100 defines the value of N, so that a group of the envelopes that are sampled may include the preset number N of envelopes. In one embodiment, the averaging circuit 130, if used, is configured to add the peak PTP voltage values (e.g., VPE1, VPE2, to VPEN) of the preset number N of the respective successive envelopes 88 in the group to obtain a sum and to divide the sum by the preset number N to generate an output signal 132. The output signal 132 has values proportional to an average of the greatest (or peak) PTP voltage values (VPE) of the respective N envelopes 88.

If averaging is done, the average of the N sampled VPEs of the N envelopes is referred to as an average of the PTP voltage values VPE of the respective N envelopes, and may also be referred to as the "average peak voltage" or "average peak voltage" (APV) value of the N envelopes. As a result, the averaging circuit 130 may be described as being responsive to a group (N) of the held values (VPE). The held values VPE represent the peak voltage amplitudes 90 of respective envelopes 88 occurring in succession during one of the update time periods.

Recalling that the values VPE relate to the amplitude 90 of the envelopes 88 of the detector signal 86, and that the amplitudes 90 are in proportion to peak, peak-to-peak voltage values as a function of time of a respective ON mode pulse 70, the APV values of the signal 132 are proportional to the average PTP voltage of N ON mode pulses 70 of the signal 68P. In embodiments where averaging is desired, the circuit 130 generates the output signal 132 in proportion to the averages of the peak voltage amplitudes (in the form of the APVs), and the signal 132 from the averaging circuit 130 is in proportion to an average of the group of N held values of the VPEs.

Figure 7:
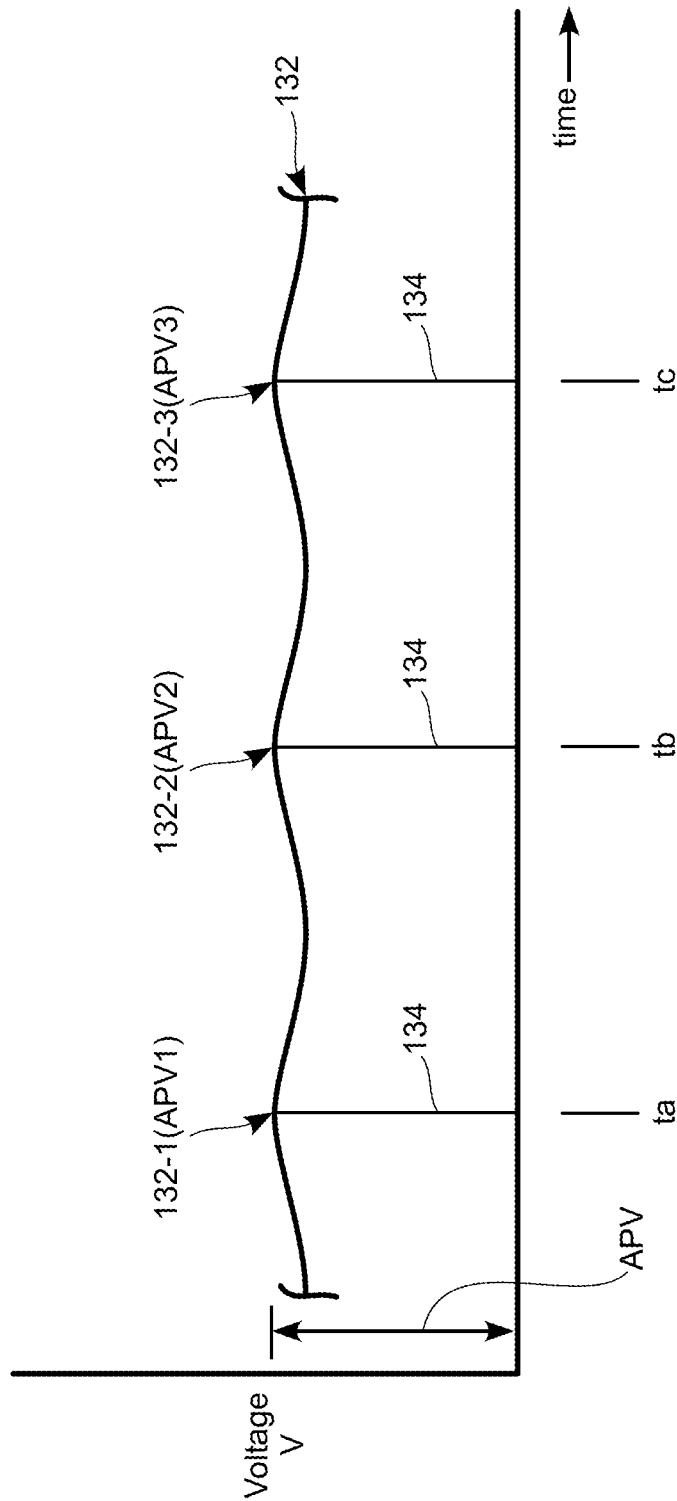
FIG. 7 is a graph showing an exemplary output signal generated by the sample and hold circuit 100, illustrating the signal having amplitudes.

FIG. 7 shows an exemplary output signal 132 generated by the circuit 100. The signal 132 is shown having amplitudes 134. Voltage values of successive amplitudes 134 are in proportion to respective ones of the APV (e.g., APV1, APV2 . . . APVN) that represent (e.g., are in proportion to) the average of the greatest PTP voltage values VPE of respective successive N envelopes 88. The output signal 132 represents one average peak voltage value APV for each of "N" successive envelopes 88 that are sampled, and one amplitude 134 corresponds to each APV. For ease of description a signal 132-1 is shown (in parentheses) corresponding to APV1 at an exemplary time ta, and a signal 132-2 is shown corresponding to APV2 at an exemplary time tb, and a signal 132-3 is shown corresponding to APV3 at an exemplary time tc. It may be understood that these successive average peak voltage values APV represented by the signal 132 are not influenced by, or a function of, the duty cycle of the pulsed RF bias signal 68P, and that the signal 132 is thus independent of the duty cycle, and is not based on the OFF modes of the pulsed RF bias signal 68P. Rather, with respect to successive voltage values of amplitudes 134 corresponding to exemplary APV1, APV2 to APVN represented by the signal 132, respective ones of these successive voltage values APV1, APV2 to APVN are based only on (are proportional to) the respective peak voltage amplitude values VPE of the respective N envelopes 88. In turn, the VPE of an envelope 88 is based on (proportional to) the PTP voltage value of the respective cycle 76P, and a respective one peak voltage value VPE corresponds to a respective one of the successive pulses 70 of the pulsed RF bias signal 68P during the successive ON modes of the pulsed RF bias signal 68P.

If used, the averaging circuit 130 may be configured based on selecting the preset number N according to the durations of the ON and OFF modes and according to an update frequency at which the output signal 132 is to be updated. For example, for a given time period between updates of the output signal 132, the longer the ON modes the fewer pulses there will be, and the less N will be. Similarly, for a given time period between updates of the output signal 132, the longer the OFF modes the fewer pulses 70 there will be, and the less N there will be.

Figure 8:
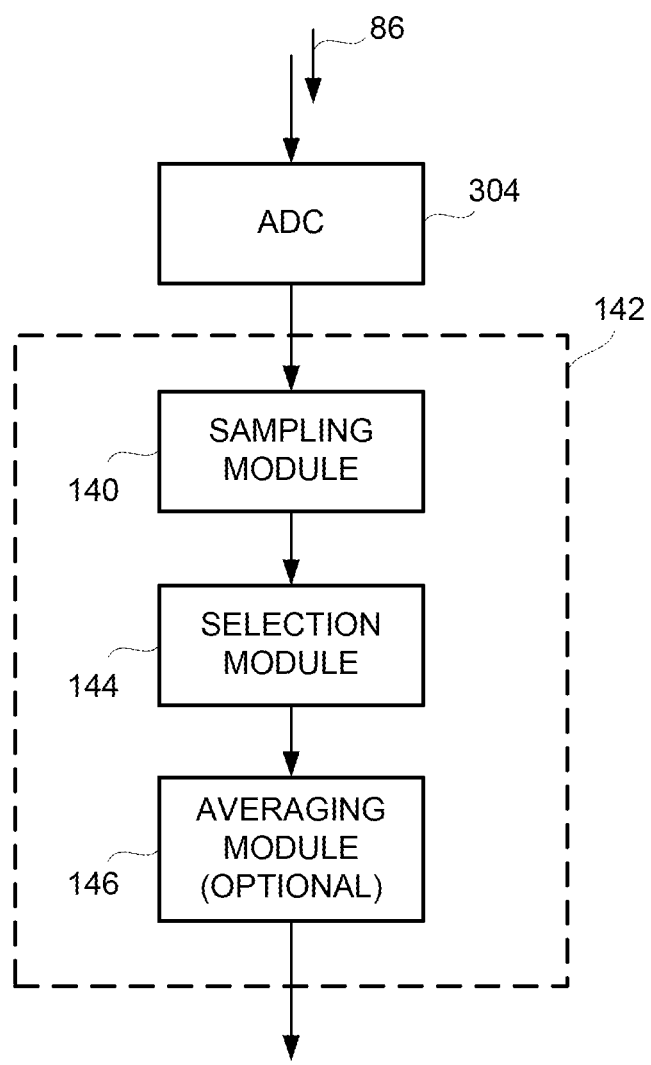
FIG. 8 is a schematic diagram of modules for programming a computer to sample a number of envelopes and to output an average.

As described in more detail below, the sample and hold circuit 100 may convert an analog voltage (such as VPE) to digital format, rendering the digitized VPE suitable for computer processing. Another embodiment of the sample and hold circuit 100 may be configured as shown in FIG. 8. FIG. 8 shows a sampling module 140 for programming a computer 142 to sample a plurality of digitized values of the amplitude 90 (FIG. 4) of the respective envelopes 88. A selecting module 144 may also determine which of the plurality of sampled amplitude values is the "peak" PTP value VPE, i.e., which is the greatest peak-to-peak voltage value VPE of the respective envelope 88.

The selecting module 144 may be configured to make the determination with respect to two sampled amplitude values of the peak-to-peak voltage value PTP of the respective envelope 88 (values VPE, FIG. 4) and to hold the higher value sample PTP. The selecting module 144 may make the determination with respect to the held higher value sample PTP and to a next sample of the amplitude value PTP of the respective envelope and to hold the higher value sample. The selecting module 144 may stop making the determinations when the next sample PTP is not the higher value sample, and holds the last higher value sample as the VPE of the respective envelope 88 for use in generating the output signal 132. Alternatively, the selecting module 144 may determine which of the plurality of sampled amplitude values is the "peak" PTP value VPE of the respective envelope 88 by averaging. In this case, many (e.g., n) PTP voltage values of the respective envelope 88 may be sampled by the module 140 and the selecting module 144 may determine a value of an average of the n PTP voltage values to determine the VPE of the respective envelope 88.

FIG. 8 shows that the computer 142 of the sample and hold circuit 100 may be optionally configured with an averaging module 146. The module 146 may be configured to define the preset number N of successive envelopes 88, and N is according to the update frequency of the generator 80 (as described above). With N defined, a group of the envelopes 88 may include the preset number N of envelopes. The averaging module 146 may be configured to cause the computer 142 to add the peak PTP voltage values (e.g., VPE1, VPE2, to VPEN) of the preset number N of the respective successive envelopes 88 in the group to obtain a sum and to divide the sum by the preset number N to generate the output signal 132.

The output signal 132 has values proportional to the average of the peak (i.e., greatest) PTP voltage values (VPE) of the respective N envelopes 88. As described above, the average of the N sampled VPEs of the N envelopes is referred to as the "average peak voltage" (APV) value of the N envelopes. As a result, the averaging module 146 is described as being responsive to a group (N) of the values (VPE). The computer 142 outputs digital values VPE representing (in proportion to) the peak voltage amplitudes 90 of respective envelopes 88 occurring in succession during one of the update time periods, and the sample and hold circuit 100 converts the digital values for output as the output signal 132 in proportion to the averages of the peak voltage amplitudes (in the form of the VPEs).

Generally, the computer 142 operates at a clock frequency and not at the frequency at which the envelopes 88 are output by the detector 84. For example, when the computer 142 is used to provide the digital values for conversion for output as the signals 132, a feedback circuit 150 described below is "closed" about every 100 ms, whereas the embodiment of the control circuit 82 configured with the circuits 100, 102, 120, 122, and 130 may close the feedback circuit 150 at the Nyquist rate, that is, as fast as is compatible with the sampling rate based on the pulse rate signal 104 or the trigger signal 106. Closure at a rate not in excess of the Nyquist rate ensures loop stability and still provides a fast loop response, e.g., at about a 1 kHZ loop response frequency. In view of the operation of the computer 142 at the clock frequency, to avoid jitter it may be preferred to use the sample and hold circuit 100 and the timing circuit 102 as described above so as to synchronize the sampling with the pulses 70 (via the signals 104 or the envelopes 88).

FIG. 3 also shows the apparatus 82 as including a feedback circuit 150 for controlling the voltage values of the pulsed RF bias signal 68P applied to the bias electrode 66. The feedback circuit 150 generates a control signal 152 at the update rate. The update rate is less than the pulse rate and defines a time period between updates of the control signal 152. The feedback circuit 150 shown in FIG. 3 includes a summing amplifier 154 that receives the output signal 132 from the averaging circuit 130 and receives a set point voltage signal 156 that defines a reference for the desired voltage of the pulsed RF signal 68P.

Figure 9:
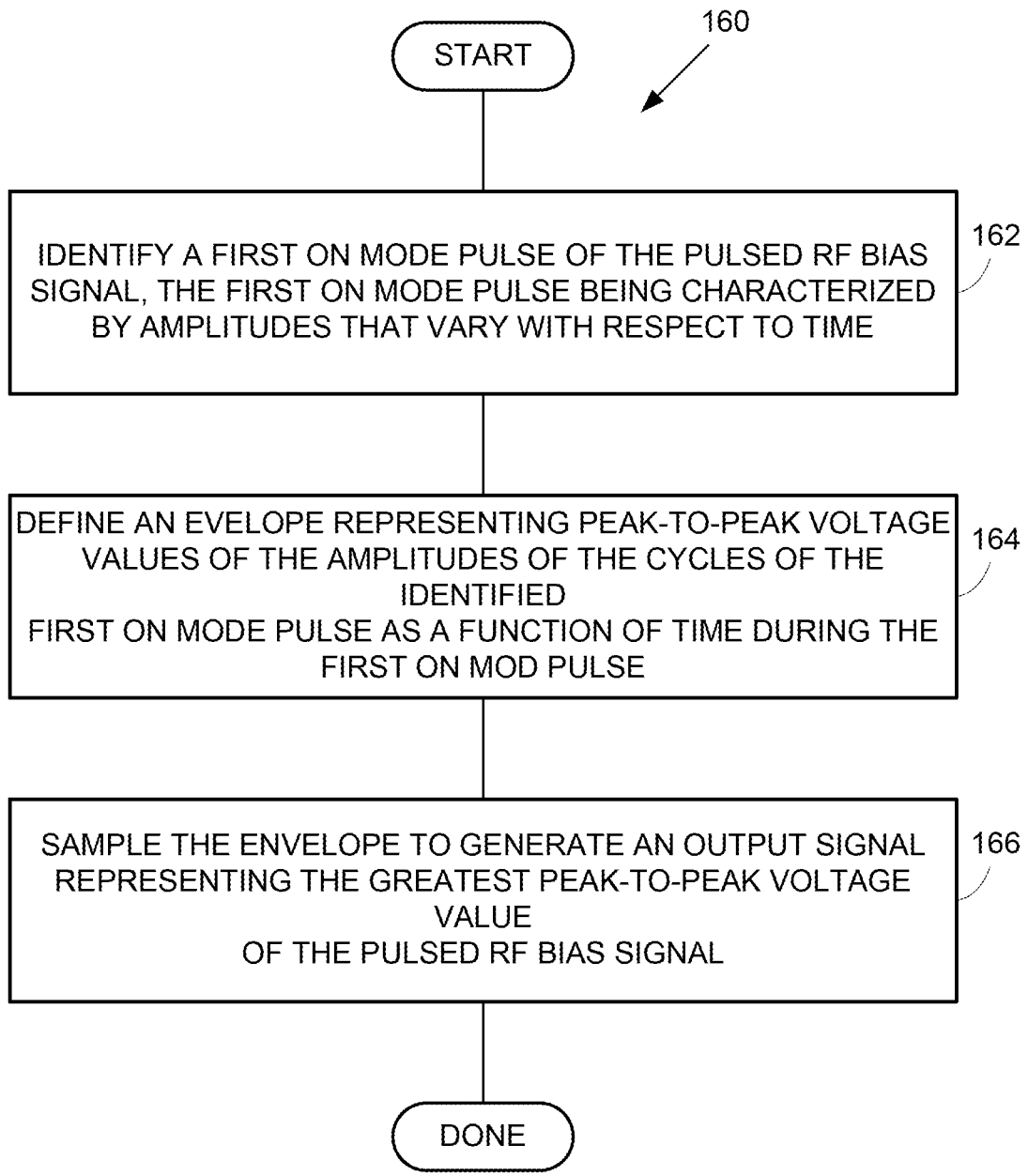
FIGS. 9 through 15 are flow charts illustrating various embodiments of a method of the present invention for determining a peak-to-peak voltage value of a pulsed RF bias signal applied to an RF bias electrode according to an embodiment of the present invention.

FIG. 9 illustrates a method of determining a peak-to-peak voltage value of a pulsed RF bias signal applied to an RF bias electrode supporting a substrate in a substrate processing chamber. As described with respect to FIG. 2, the applied signal may be signal 68P consisting of alternating modes. The modes may thus comprise the ON mode of pulse 70 and the OFF mode 72 and the ON mode of the next pulse 70 in the series of modes. An exemplary series of modes is shown in FIG. 2 represented by pulses 70 and zero voltage conditions 72. The method is shown in a flow chart 160 in FIG. 9 and may move from start to an operation 162 of identifying a first ON mode pulse of the pulsed RF bias signal, the first ON mode pulse being characterized by amplitudes that vary with respect to time.

Operation 162 may identify the first ON mode pulse 70-1 shown in FIG. 2 of the pulsed RF bias signal 68P. The first ON mode pulse 70-1 is shown characterized by amplitudes 74 that vary with respect to time t. The method may move to an operation 164 of defining an envelope representing peak-to-peak voltage values of the amplitudes of the cycles of the identified first ON mode pulse as a function of time during the first ON mode pulse. The envelope defined may be the exemplary envelope 88-1, that represents peak-to-peak voltage values of the amplitudes 74 of the identified first ON mode pulse 70-1 as a function of time t during pulse 70-1. The envelopes 88 may consist of amplitudes 90 having values that are proportional to the peak-to-peak voltage values of the amplitudes 74 of the cycles of the identified first ON mode pulse. The method may move to an operation 166 of sampling the envelope to generate an output signal representing the greatest peak-to-peak voltage value of the pulsed RF bias signal (i.e., the value of cycle 76P). It is possible, however, to select more than one peak-to-peak values in a given envelope, and it may or may not be that the selected one or ones include the peak (e.g., greatest) peak-to-peak value. Operation 166 may sample the exemplary envelope 88-1 to generate (as an output signal) the detector signal 86 that represents the peak PTP voltage value shown in FIG. 2 as VPE1 of envelope 88-1 that corresponds to the pulsed RF bias signal 68P. The detector signal 86 has values that are proportional to the peak-to-peak voltage values of the amplitudes 74 of the cycles of the identified first ON mode pulse. The method may move to DONE.

Figure 10:
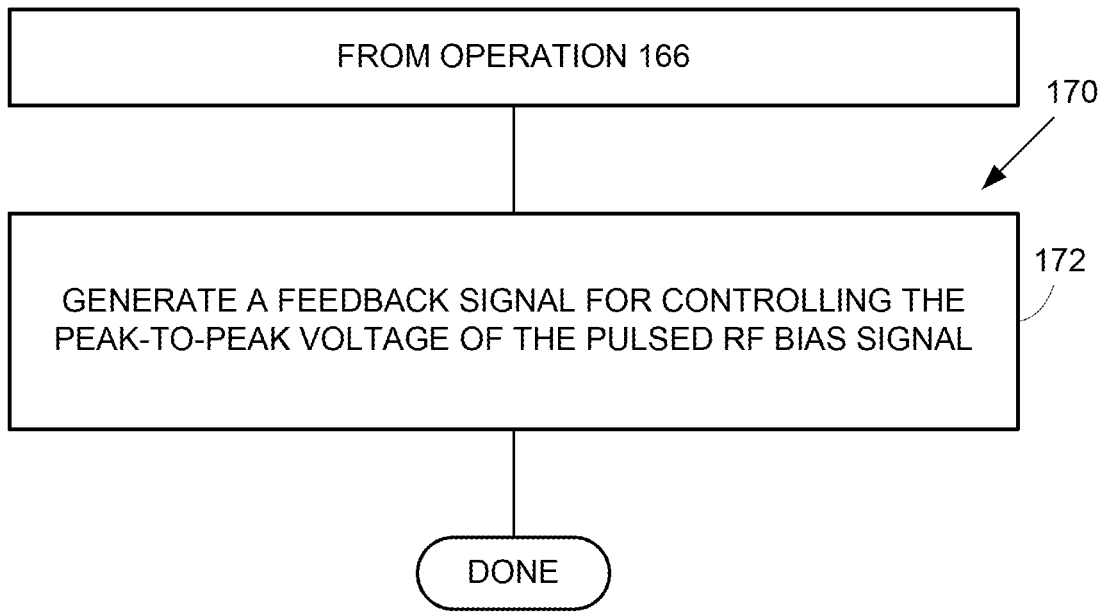

A further operation of the method is shown in FIG. 10 by a flow chart 170. From operation 166 the method of flow chart 170 may include an operation 172 of generating a feedback signal for controlling the peak-to-peak voltage value of the pulsed RF bias signal. The feedback signal may be based on the greatest peak-to-peak voltage value of the output signal and on a desired peak-to-peak voltage value of the pulsed RF bias signal. For example, the generated feedback signal may be the described signal 152 that is used to control the voltage value (e.g., amplitude 74, FIG. 2) of the pulsed RF bias signal 68P. As described with respect to FIGS. 3 and 6, for example, the feedback signal 152 may be based on the peak-to-peak voltage values VPE (resulting in the average peak voltage values APV) of signal 132 (FIG. 7) and on a desired set point value 156 of the pulsed RF bias signal 68P as supplied to the summing amplifier 154. The method may then be DONE.

Figure 11:
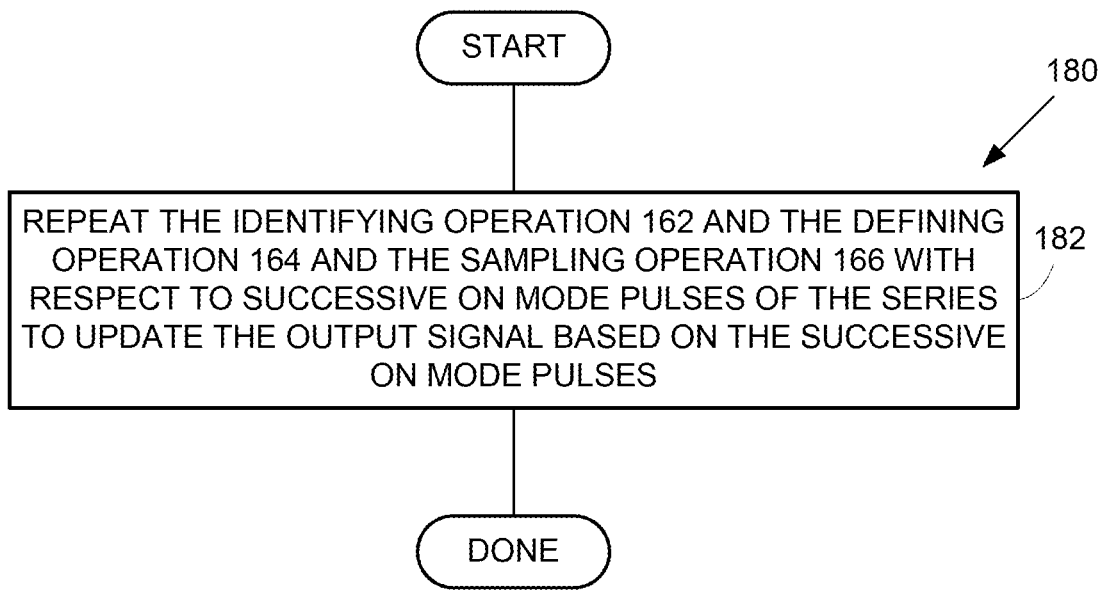

A further operation of the method is shown in FIG. 11 by a flow chart 180 that moves to an operation 182 of repeating the identifying, defining, and sampling operations with respect to successive ON mode pulses of the series to update the output signal based on the successive ON mode pulses. These repeated operations may be operations 162, 164, and 166 performed in sequence to identify the next exemplary pulse 70-2, define the next exemplary envelope 88-2, and to sample the next exemplary envelope 88-2 to generate (as another output signal) the detector signal 86 that represents the peak PTP voltage value. For one repeated set of operations, such signal 86 includes (FIG. 2) VPE2 of envelope 88-2, for example, and further repeating is with respect to the other exemplary pulses 70-3 generating VPE3 of an exemplary envelope 88-3, etc. The method may then be DONE.

Figure 12:
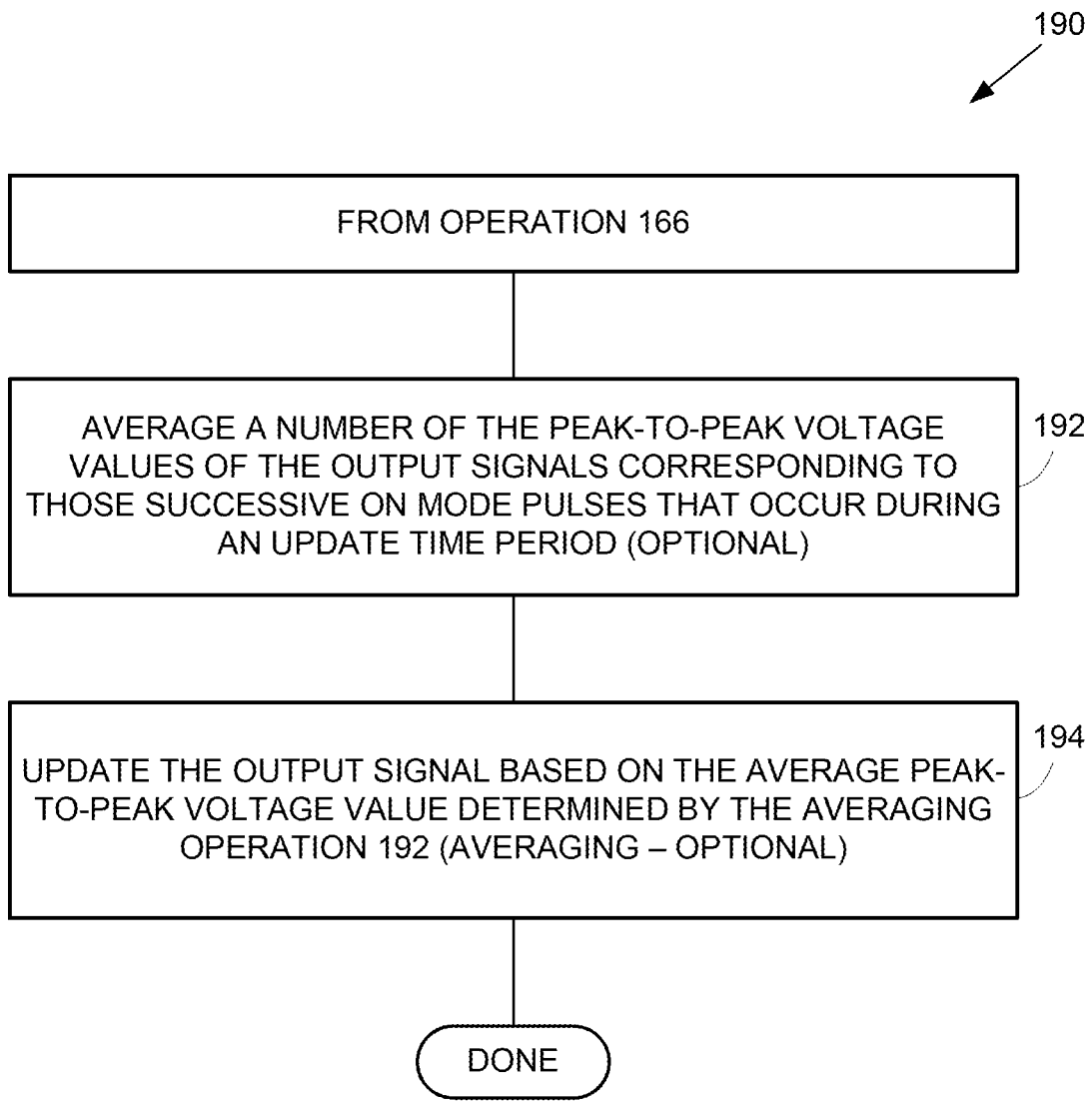

A further embodiment of the method is shown in FIG. 12 by a flow chart 190 that moves from operation 166 to an operation 192 of averaging a number of the peak-to-peak voltage values of the output signals corresponding to those successive ON mode pulses that occur during an update time period. The update time period may define a time period between updates of the output signal. The averaging may be performed by obtaining a sum of the corresponding peak-to-peak voltage values and dividing the sum by the number. The number of the peak-to-peak voltage values may be N described with respect to FIGS. 4 and 5. The peak-to-peak voltage values may be values VPE in FIG. 4 and values VPE1, VPE2, etc. in FIG. 5 corresponding to the successive ON mode pulses 70-1, 70-2, etc. and corresponding to envelopes 88-1, 88-2, etc. that occur during an update time period. The update time period may define a time period between updates of the output signal 132 and between updates of the feedback signal 152.

The averaging may be performed by obtaining a sum of the corresponding N peak-to-peak voltage values VPE (e.g., VPE1, VPE2, etc., FIG. 4) and dividing the sum by the number N. The method may move to an operation 194 of updating the output signal based on the average peak-to-peak voltage value determined by the averaging operation 192. In operation 194, the output signal 152 is updated based on the next average peak-to-peak voltage value APV (e.g., APV3, FIG. 7) determined by the averaging operation 192. The method may then be DONE.

Figure 13:
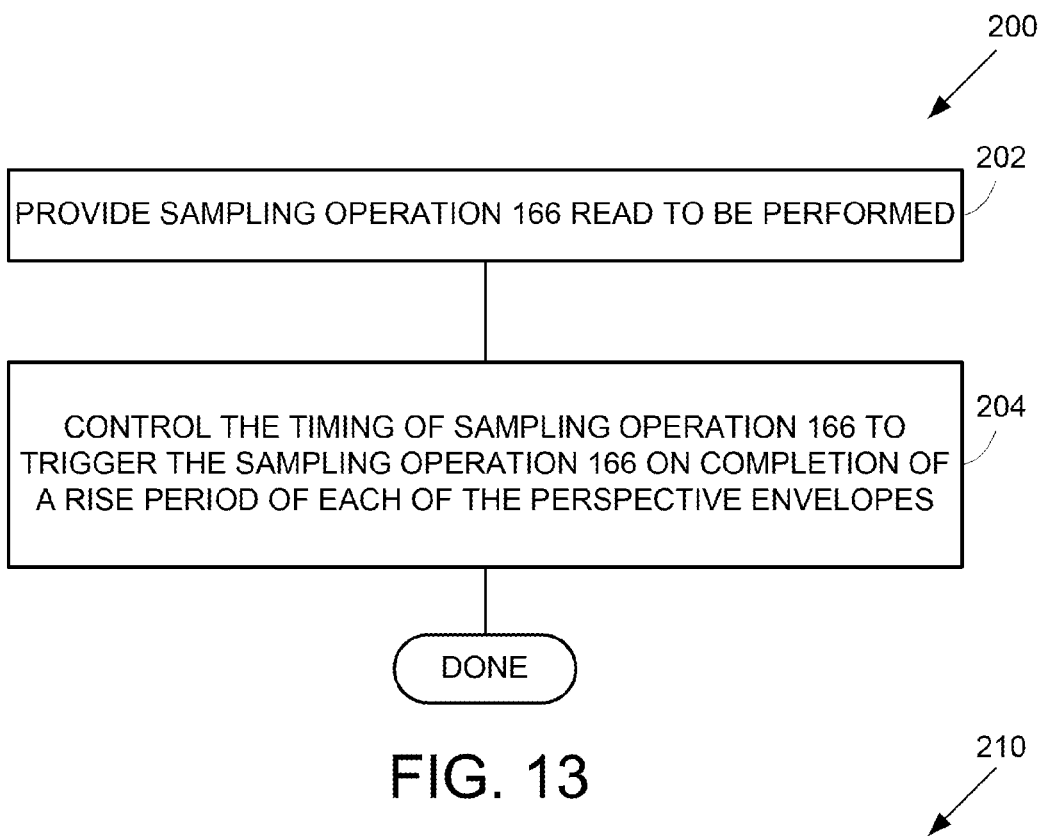

A further embodiment of the method is shown in FIG. 13 by a flow chart 200. The method moves to an operation 202 of providing a sampling operation 166 in a ready condition. The method moves to an operation 204 of controlling the timing of the sampling operation. The controlling operation 204 triggers the sampling operation 166 on completion of a rise period of each of the respective envelopes. In this manner, each sampled value represents the greatest of the peak-to-peak voltage values represented by the respective envelope so that the generated output signal represents the greatest peak-to-peak voltage value of the pulsed RF bias signal.

In operation 204, the trigger signal may be the signal 106 (FIG. 3) for triggering the sample and hold circuit 100 on completion of the rise period 108 of each of the respective envelopes 88. Considering an exemplary second time delay of from time tiii to time ts1 (FIG. 4), each sampled value (e.g., VPE1 at time ts1, FIG. 4) represents the greatest (or peak) of the peak-to-peak voltage values VPE of the respective envelope 88. The method may then be DONE.

Figure 14:
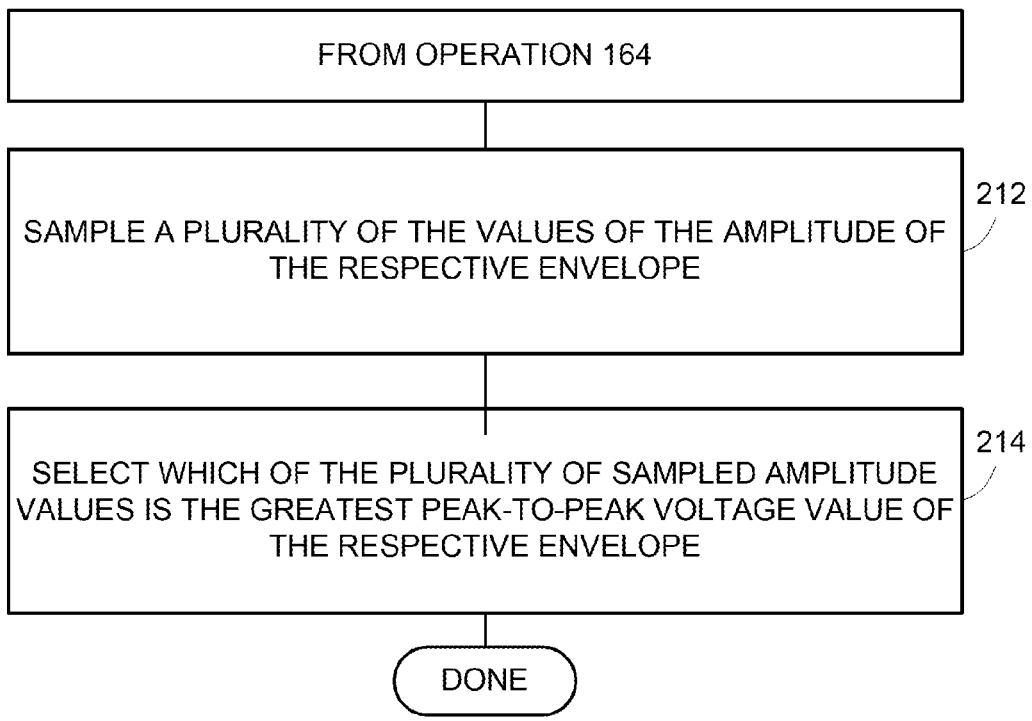

A further embodiment of the method is shown in FIG. 14 by a flow chart 210 that moves from operation 164 to an operation 212 of sampling a plurality of the values of the amplitude of the respective envelope. The sampling may be of a plurality of the values of the amplitude 74 (FIG. 2) of the respective envelope 88-1 (FIG. 4), for example. Exemplary values are described as VPE with respect to FIG. 4. The method may move to operation 214 by selecting which of the plurality of sampled amplitude values VPE is the greatest (or peak) peak-to-peak voltage value of the respective envelope. Operation 214 may select, from those sampled amplitude values VPE of the exemplary envelope 88-1, an exemplary value VPE1 as the peak of the peak-to-peak voltage values VPE of the respective envelope 88-1.

VPE1 is output and used in operation 192 to obtain an APV value, e.g., APV1, of the signal 132. The method may then be DONE.

A further embodiment of the method may be performed by a series of determinations. For example, operation 214 of selecting may make an initial determination with respect to two sampled amplitude values of the peak-to-peak voltage value of the respective envelope and hold the higher value sample. The initial determination may be with respect to two of the sampled amplitude values VPE (FIG. 4) of the respective exemplary envelope 88-1 and hold the higher value sample. An exemplary one of this higher value sample could be VPE2 as shown in FIG. 4, as compared to value VPE1. As a further example, operation 214 of selecting may make another determination with respect to the held higher value sample and a next sample of the amplitude value of the respective envelope and may hold the higher value sample. An exemplary one of this higher value sample could again be VPE2 as shown in FIG. 4, as compared to a later value VPE3 of a later envelope 88-3 (that would be later than envelope 88-2 of FIG. 4). Operation 214 would stop making the determinations when the next sample (e.g., VPE3 after VPE2) is not the higher value sample and would hold the higher value sample VPE2 for use in operation 192 for generating the output signal 132 having a value in proportion to the greatest held voltage value VPE2. These operations 214 may be as described with respect to the computer 142 and modules 140 and 144, for example.

Figure 15:
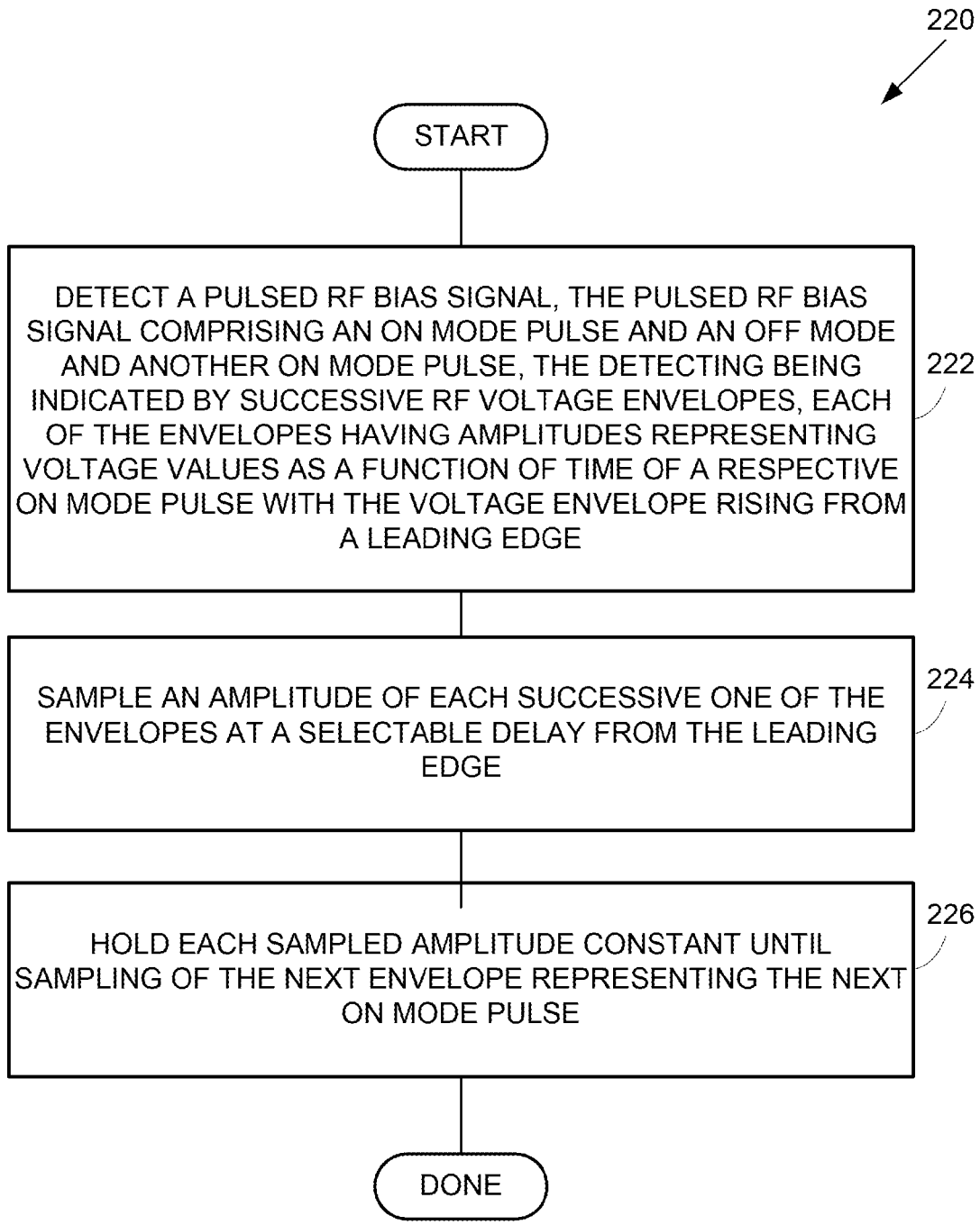

A further embodiment of a method of the present invention may be understood by reference to flow chart 220 shown in FIG. 15. From start, the method moves to an operation 222 of detecting a pulsed RF bias signal. The signal comprises an ON mode and an OFF mode and another ON mode, for example. The detecting is indicated by successive RF envelopes, and each of the envelopes has an amplitude representing voltage values as a function of time of a respective ON mode pulse. The voltage envelope rises from a leading edge. The RF bias signal is thus as described with respect to FIG. 2, and includes the pulses 70 and OFF mode 72. The leading edge of envelope 88 is from time ti shown in FIG. 4, and envelope 88 has the amplitude 90. As described with respect to FIG. 3, detector 84 performs the detecting as indicated by the successive RF envelopes 88. The method may move to an operation 224 of sampling an amplitude of each successive one of the envelopes at a selectable delay from the leading edge. Such sampling may be by the described sampling performed by sample and hold circuit 100, and a sampled amplitude is referred to above as VPE. Successive ones of the envelopes 88 are sampled at a selectable delay from the leading edge, and this delay has been described as two-fold, for example, in terms of the first and second delays, the first starting at time ti at which the leading edge of the envelope 88 is located.

Thus, delays from ti to ts1 may be selected so that the sampled amplitude represents, and is proportional to, the greatest voltage value of the one pulse 70 that corresponds to the one envelope 88 being sampled at the time ts1. The method may move to an operation 226 of holding each sampled amplitude 90. In the embodiment where more than one envelope is examined, holding by the sample and hold circuit 100 continues until the sampling of the amplitude of the next envelope. As noted above, in alternate embodiments, corrections and adjustments may be made by taking data of only a single envelope. As viewed in FIG. 4, the holding may be until the next time ts1 after the next tOFF, for example, since the next sampling occurs with respect to the next successive envelope 88-2. The method may move to DONE.

Figure 16:
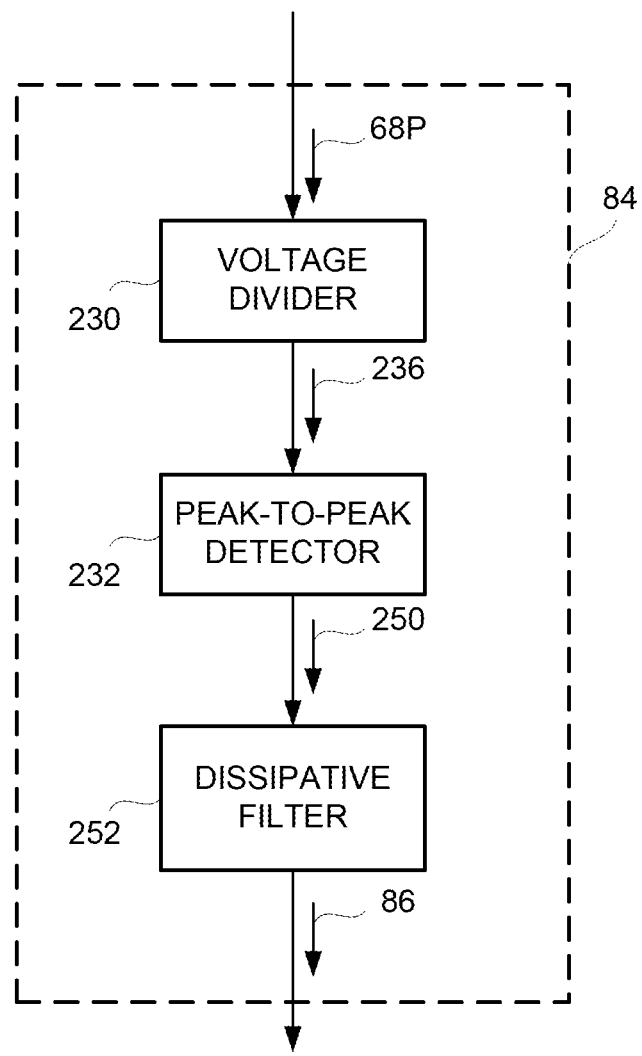
FIG. 16 is a schematic diagram showing a detector configured with a capacitive voltage divider that receives the pulsed RF bias signal.

FIG. 16 shows the detector 84 configured with a capacitive voltage divider 230 that receives the pulsed RF bias signal 68P. As described above, voltage values of the signal 68P may be in the 1000 volt range. Values of capacitance of the divider 230 are selected so as to reduce the incoming voltage applied to a PTP detector 232 to a value within the voltage rating of a diode network 234 of the detector 232. For example, with an exemplary 10:1 voltage ratio, the exemplary 1000 volt voltage value of the signal 68P may be converted to a reduced signal 236 of about 100 volts applied to PTP detector 232. More preferably, the voltage of the reduced signal is about 80 volts when the voltage rating of the diodes of the network is about 100 volts.

Figure 17:
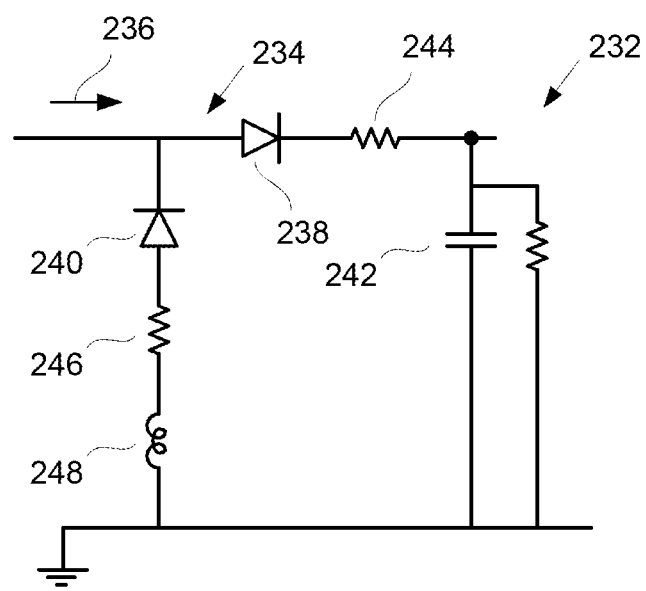
FIG. 17 is a schematic diagram showing the detector configured with a diode network composed of alternately conducting diodes.

The PTP detector 232 may be configured as shown in FIG. 17 with the diode network 234 composed of alternately conducting diodes 238 and 240. The network 234 is effective to pass the positive and negative peaks of the RF signal 236 to capacitor 242 so as to fully charge capacitor 242 in proportion to the PTP voltage of a cycle 76 of a pulse 70 of pulsed RF bias signal 68P. Each diode 238 and 240 may be a MMSD4148, for example, and is configured with a fast response time to be able to conduct the short cycles 76 of the pulse 70, and each typically has a relatively low peak current capacity. A typical diode response time may be from about 1 nanoseconds (ns) to about 1000 ns, and 4 ns is preferred. Therefore, values of resistance of resistors 244 and 246, and the inductance of inductor 248, are selected so that each of the diodes 238 and 240 conducts approximately the same current value, and that value is within the low current capacity.

Figure 18:
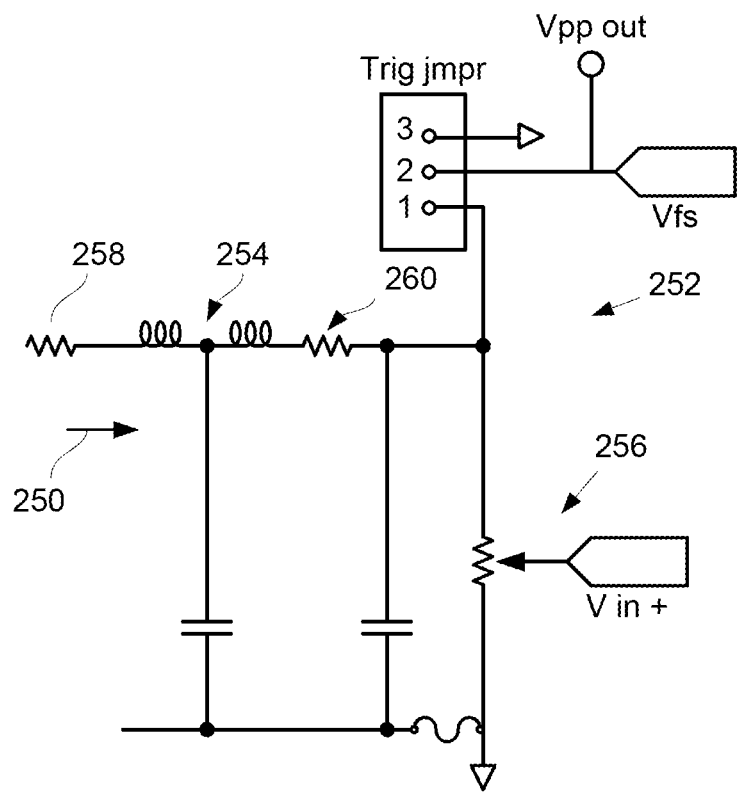
FIG. 18 is a schematic diagram showing a dissipative filter to both filter out any RF noise that might otherwise appear on the envelope and to adjust a value of voltage to a value compatible with the sample and hold circuit.

The voltage of capacitor 242 is applied as an intermediate PTP signal 250 (FIG. 18) to a dissipative filter 252 configured as a modified T filter 254 with a voltage divider 256 to both filter out any RF noise that might otherwise appear on the envelope 88, and to adjust the value of the voltage of the signal 250 to a value that is compatible with the sample and hold circuit 100. The dissipative filter 252 outputs the detector signal 86 to the sample and hold circuit 100. FIG. 18 shows the filter 254 configured for such filtering out of the RF noise. Also, values of resistors 258 and 260 are selected to reduce increased Q that results from the filtering by the filter 254. The high Q would not be compatible with the short pulses 70. The resistors 258 and 260 reduce the Q so that the rise time from time ti to time tiii of the envelope 88 (FIG. 4) represented by the detector signal 86 is limited to about three cycles 76, for example. This short rise time enables the sample and hold circuit 100 to sample the peak PTP amplitudes 74 in less time, providing more flexibility in selecting the number N of envelopes 88 to be included in averaging by the averaging circuit 130, for example. As noted herein, the operation of averaging is optional.

As described above, in FIGS. 4 and 5 the time ti indicates the time at which the pulse state signal 104 occurs (or the envelope 88 starts), and time tiii identifies the end of the rise period and thus the end of the first time delay. Also, the difference between times tiii and tiv in FIG. 5 represents the second time delay, starting at the end of the rise portion 108 of the envelope 88 (the end of the first time delay). FIG. 6 shows the delay circuit 118 of the timing circuit 102 configured in two stages 262 and 264 to output the trigger signal 106 at the end of a selectable delay, that has been described as at the end of the second delay following the first time delay. To initiate the operation of the timing circuit 102, the state signal 104, or the detector signal 80 indicating an envelope 88, may be applied to a Schmidtt trigger circuit of stage 262.

Figure 19:
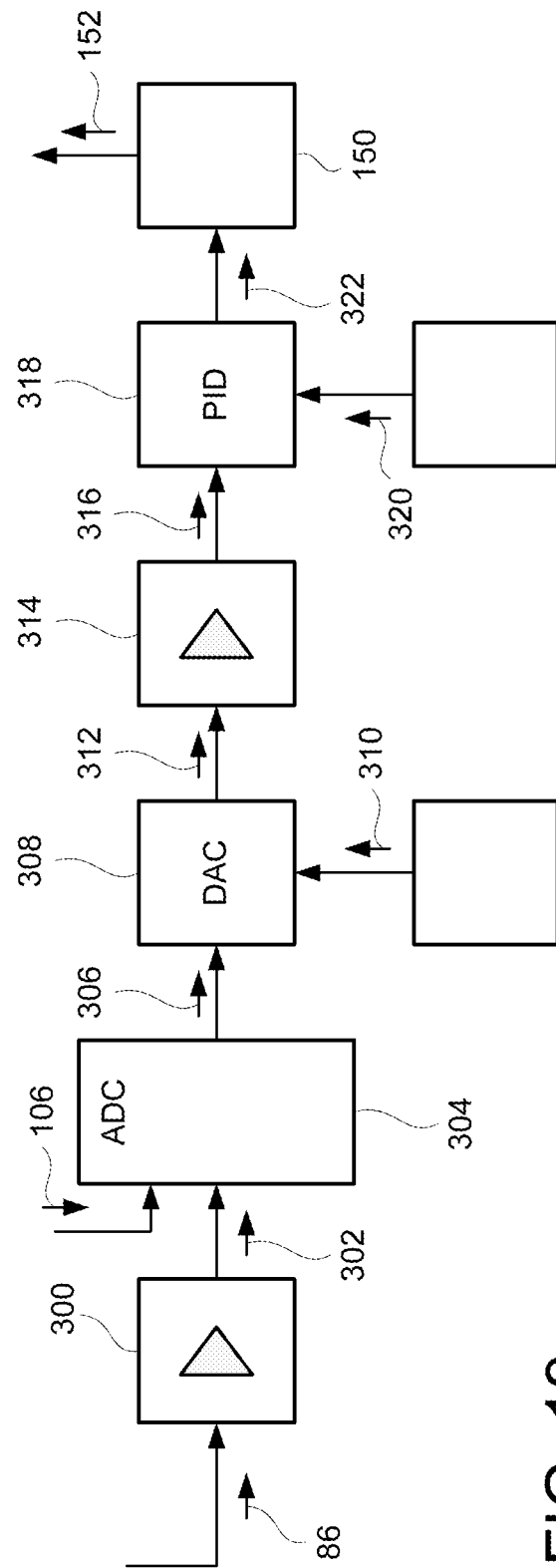
FIG. 19 is a schematic diagram showing a detector signal in the form of the envelopes applied to the sample and hold circuit, illustrating a buffer amplifier of the sample and hold circuit.

FIG. 19 shows the sample and hold circuit 100 including a buffer amplifier 300. The amplifier 300 may be an LT1363 operational amplifier, for example, having a high speed and high slew rate. The detector signal 86 in the form of the envelopes 88 is applied to the amplifier 300. An amplified output signal 302 is applied to an ADC 304 that may, for example, be an LTC1417 configured to receive the signal 302 and the trigger signal 106. On receipt of the trigger signal 106, the ADC 304 samples the amplified output signal 302 at time ts1 in the manner described above with respect to FIG. 4. An output signal 306 from the ADC 304 is applied to a DAC 308 that may, for example, be an LTC1658. The DAC holds the signal 306 in the DAC registers. Reference signal 310 is also input to the DAC 308 as required by the LTC 1658. If processing of the sampled values is required, for example averaging of samples, the processing may take place between the ADC 304 and the DAC 308, while the signal is in digital form, by a microcontroller or processor (not shown). In a typical simple case no such processing is required and the digital signal 306 from the ADC 304 is passed directly to the DAC 308.

The DAC 308 outputs a signal 312 to another buffer amplifier 314, and an amplified output signal 316 is applied to a Proportional, Derivative, Integral (PID) controller 318. The controller 318 receives the signal 316 and compares it to a value of a reference setpoint signal 320 that identifies the desired voltage value of the pulsed RF bias signal 68P. The difference (or "error") is applied as an error signal 322 to the feedback circuit 150 that outputs the feedback signal 152 to adjust the RF generator 64 so that the pulsed RF bias signal 68P is returned to the desired voltage value. The controller 318 may be configured to cause the feedback circuit 150 to adjust the output of the RF generator 64 based, for example, on the history and rate of change of the error signal 322, for accurate and stable control of the voltage of the signal 68P.

In review, it may be understood that the apparatus 40 is configured to measure the pulsed RF bias signal 68P applied to the bias electrode 66 of the chamber 42. Apparatus 40 is seen to include the detector 84 configured for response to the pulsed RF bias signal 68P. The detector 84 is configured to generate the detector signal 86 in the form of the successive RF voltage envelopes 88. Each of the envelopes 88 has the amplitudes 90 (FIG. 4) representing voltage values as a function of time of a respective ON mode pulse 70. The voltage envelope 88 is shown in FIG. 4 rising from a leading edge at time ti, corresponding to the start of portion 108.

The sample and hold circuit 100 samples an amplitude 90 of each successive one of the envelopes 88, and at a selectable delay from the leading edge. The circuit 100 is configured to hold in a digital form the amplitude 90 constant until sampling of the next envelope 88 representing the next ON mode pulse. In addition, the configuration of the circuit 100 to hold one of the amplitudes 90 constant until sampling of the next envelope 99 representing the next ON mode pulse 70 holds such amplitude 90 constant during the OFF mode 72 (following the respective ON mode pulse 68P) so that a voltage value of the OFF modes (i.e., zero) is not included in the amplitudes operated on by the averaging circuit 130. Additionally, the sampling at the selectable delay from the leading edge is effective to sample the amplitude 90 of each of the envelopes 88 to represent the greatest peak-to-peak voltage value of the respective ON mode pulse, in that the sampled VPEs of the envelopes 88 are proportional to the greatest peak-to-peak voltage values of the respective ON mode pulses. Also, the circuit 130 is provided for optionally averaging the sampled amplitudes 90 of the envelopes 88 that represent the greatest peak-to-peak voltage values of the selected number N of the respective ON mode pulses 70. If averaging is not done, it is possible to take one peak peak-to-peak voltage value from any given envelope, and use it for the adjustment. Further, more than one peak-to-peak value from a given envelope may be obtained and used for the adjustment. Still further, the processing need not be done by specific analog or digital circuitry, but such processing can be done using firmware and/or software.

In additional review, the apparatus 40 is provided with the voltage divider 230 (FIG. 16) as an RF voltage divider for attenuating the pulsed RF bias signal 68P. The attenuation brings the pulse 68P voltage down to be compatible with the specifications of the fast diodes 238 and 240. Also, the detector 84 is configured for response to the attenuated pulsed RF bias signal 68P, that is in the form of signal 236. The attenuated pulsed RF bias signal 236 has the characteristics of the ON mode pulse 70 and of the OFF mode 72 and of another ON mode pulse 70. The detector 84 is configured to generate the detector signal 86 and the signal 86 includes the successive RF voltage envelopes 88, each representing voltage values (e.g., amplitudes 74 of the pulses 70) as a function of time t. As attenuated, the voltage values of the envelopes 88 are proportional to a respective one of the ON mode pulses 70 with the voltage values rising from the leading edge as shown in FIG. 4. The dissipative filter circuit 252 removes RF noise from the envelopes, and the delay circuit 118 serves as a digital trigger and delay adjustment circuit to provide the trigger signal 106 as a sampling gate trigger at the described selectable delay from the leading edge.

The sample and hold circuit 100 is responsive to the trigger of signal 106 for sampling the voltage value of the amplitude 90 of each successive one of the envelopes 88 at the selectable delay from the leading edge (i.e., at time ts1, FIG. 4). The amplitude 90 is shown as VPE in FIG. 4. The circuit 100 is shown as being configured with the ADC 304 followed immediately by the DAC 308 to output the signal 322 for use in controlling the pulsed RF bias signal 68P. The controller 318 scales the signal 322 for application to the feedback circuit 150.

It may be further understood then, that the N envelopes 88 that are sampled and averaged are independent of the OFF mode and are based only on the tON time period of the respective pulses 70 that were detected and resulted in the respective envelopes 88. As a result, in the described embodiments of the present invention, the determination of the values of the pulsed RF bias signal 68P is not influenced by, or a function of, the duty cycle of the pulsed RF bias signal 68P because such determination is independent of the duty cycle of the pulsed RF bias signal and is not based on the OFF modes of the pulsed RF bias signal because the sample and hold circuit 100 only operates for sampling and averaging with respect to the pulses 70 (via sampling only the envelopes 88) and not sampling the OFF modes. Thus, the determination of the value of the RF bias voltage on the substrate is based only on the average of the peak PTP voltage values, i.e., only on the APV of the preset number N of pulses 70 of the pulsed RF bias signal 68P and the APV are only obtained with respect to the ON modes of those pulses 70.

The embodiments of the present invention are thus seen as avoiding the problems described above with respect to the prior attempts to obtain an accurate bias voltage of the pulsed RF bias signal, wherein the prior attempts were inaccurate by being simply based on an average of the RF bias voltage over time (i.e., averaged over the entire response time). In such prior attempts the average depended on the pulse parameters, such as duty cycle and pulse frequency, whereas the embodiments of the present invention obtain an average that is not dependent on the pulse parameters as in the PPD average. Thus, whereas the PPD average is based on the PTP voltage values of the cycles of each RF bias pulse as well as on the zero voltage value of the OFF modes between these RF bias pulses of the RF bias signal, the present averages do not include the zero voltage value of the OFF modes between the RF bias pulses of the RF bias signal.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for processing a semiconductor wafer in a plasma chamber, the method comprising:
   generating an envelope signal of a pulsed RF bias voltage signal applied to a chuck of the plasma chamber, the envelope signal being defined from a plurality of peak-to-peak voltage values that define amplitudes for the envelope signal;
   determining a sampling time at which to sample the envelope signal to obtain a maximum voltage value associated with at least one of the peak-to-peak voltage values in the envelope signal;
   generating a feedback signal for the obtained maximum voltage value; and
   adjusting a voltage of the pulsed RF bias voltage signal applied to the chuck based on the obtained maximum voltage value received from the feedback signal and a reference voltage value of the pulsed RF bias voltage.

2. The method as recited in claim 1, further including:
   generating an output signal by holding constant the obtained maximum voltage value.

3. The method as recited in claim 1, wherein adjusting the voltage of the pulsed RF bias voltage is based on a difference between the feedback signal and the reference voltage value.

4. The method as recited in claim 1, wherein electrical characteristics of a plasma are held steady during processing to compensate for a variation of an impedance presented to the chuck.

5. The method as recited in claim 1, wherein adjusting a voltage of the pulsed RF bias voltage further includes:
   averaging a plurality of sampled values of the envelope signal corresponding to a plurality of pulses of the pulsed RF bias voltage.

6. The method as recited in claim 1, wherein the pulsed RF bias voltage comprises RF cycles, each RF cycle having an ON mode where an RF voltage is provided and an OFF mode where no RF voltage is provided.

7. The method as recited in claim 1, further including:
   fabricating at least part of an integrated circuit in a plasma chamber having the chuck utilizing the adjusted pulsed RF bias voltage signal applied to the chuck.

8. A method for processing a semiconductor wafer in a plasma chamber, the method comprising:

generating an envelope signal of a pulsed RF bias voltage signal applied to a chuck of the plasma chamber, the envelope signal being defined from a plurality of peak-to-peak voltage values that define amplitudes for the envelope signal;

determining a sampling time at which to sample the envelope signal to obtain a maximum voltage value associated with at least one of the peak-to-peak voltage values in the envelope signal;

repeating the generating and the determining for a plurality of RF cycles, each RF cycle having an ON mode and an OFF mode, such that said pulsed RF bias voltage signal is applied during said ON mode;

generating a feedback signal for a plurality of obtained maximum voltage values, the plurality of obtained maximum voltage values being averaged to define a maximum voltage value; and adjusting a voltage of the pulsed RF bias voltage signal applied to the chuck based on the maximum voltage value received from the feedback signal and a set point voltage signal, the set point voltage signal representing a desired voltage value for the pulsed RF bias voltage signal applied to the chuck.

9. The method of claim 8, wherein the plurality of obtained maximum voltage values are averaged for the ON mode and does not include values sampled during the OFF mode.

10. The method of claim 9, further comprising,
holding the sampled envelope signal captured during the ON mode while in the OFF mode.

11. The method of claim 8, wherein determining the sampling time includes,
detecting a rising edge of each of pulse of the pulsed RF bias voltage signal; and
determining a delay time for the rising edge so that the sampling time corresponds to the obtained maximum voltage values.

* * * * *